United States Patent
Basker et al.

(10) Patent No.: US 9,431,296 B2
(45) Date of Patent: Aug. 30, 2016

(54) STRUCTURE AND METHOD TO FORM LINER SILICIDE WITH IMPROVED CONTACT RESISTANCE AND RELIABLITY

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Los Altos, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 8 days.

(21) Appl. No.: 14/315,514

(22) Filed: Jun. 26, 2014

(65) Prior Publication Data

US 2015/0380305 A1    Dec. 31, 2015

(51) Int. Cl.
| | |
|---|---|
| *H01L 21/768* | (2006.01) |
| *H01L 27/092* | (2006.01) |
| *H01L 21/8238* | (2006.01) |
| *H01L 21/84* | (2006.01) |
| *H01L 27/12* | (2006.01) |

(52) U.S. Cl.
CPC ... *H01L 21/76846* (2013.01); *H01L 21/76844* (2013.01); *H01L 21/76889* (2013.01); *H01L 21/823821* (2013.01); *H01L 21/845* (2013.01); *H01L 27/0924* (2013.01); *H01L 27/1211* (2013.01); *H01L 21/823871* (2013.01)

(58) Field of Classification Search
CPC .................. H01L 21/76834; H01L 21/76844; H01L 21/76831; H01L 21/76843; H01L 21/76847; H01L 21/76852; H01L 21/76889; H01L 29/665; H01L 21/76883; H01L 21/76897; H01L 21/823821; H01L 29/0847; H01L 21/76846; H01L 21/845; H01L 27/0924; H01L 29/41791
USPC ....... 438/586, 639, 643, 672, 655, 664, 683, 438/300; 257/384, 382
See application file for complete search history.

(56) References Cited

U.S. PATENT DOCUMENTS

| | | | |
|---|---|---|---|
| 7,521,314 B2 | 4/2009 | Jawarani et al. | |
| 2006/0043429 A1* | 3/2006 | Huglin et al. | 257/213 |
| 2008/0157220 A1* | 7/2008 | Joo | 257/384 |
| 2008/0290421 A1* | 11/2008 | Wang | H01L 29/665 257/384 |
| 2013/0113027 A1* | 5/2013 | Chiang | H01L 21/28518 438/300 |
| 2015/0108590 A1* | 4/2015 | Alptekin et al. | 257/411 |

* cited by examiner

*Primary Examiner* — Bac Au
*Assistant Examiner* — Toniae Thomas
(74) *Attorney, Agent, or Firm* — Scully, Scott, Murphy & Presser, P.C.; Steven J. Meyers

(57) ABSTRACT

A contact structure with improved contact resistance and reliability is provided by forming an inner spacer between a contact liner and dielectric layers laterally surrounding the contact structure. The inner spacer severs as a barrier to prevent diffusion of metals from the contact liner into the dielectric layers.

20 Claims, 17 Drawing Sheets

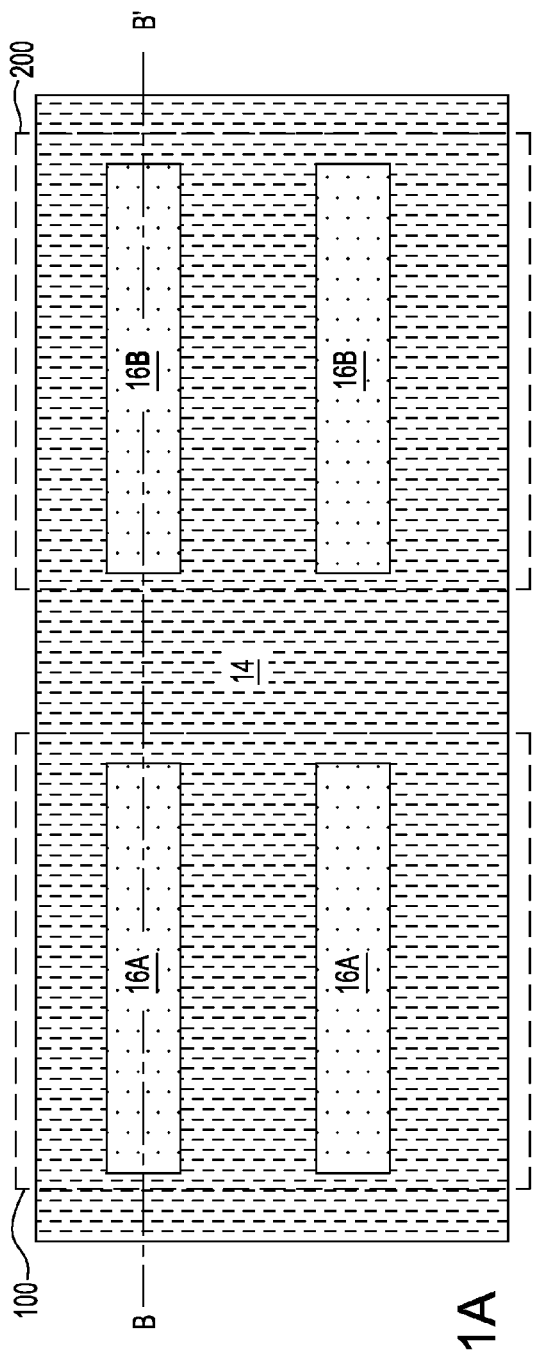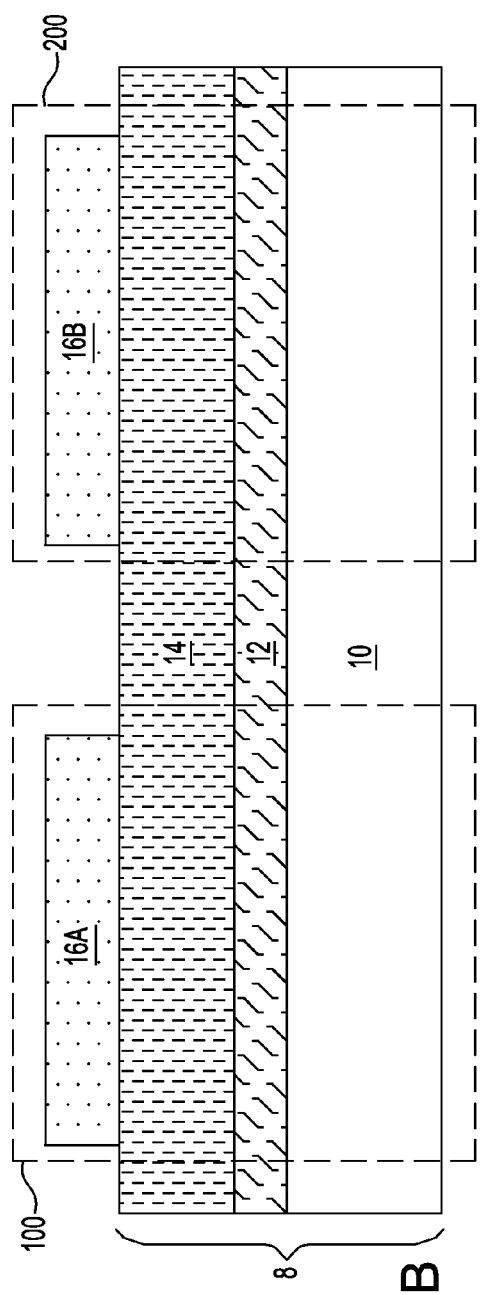
FIG. 1A
FIG. 1B

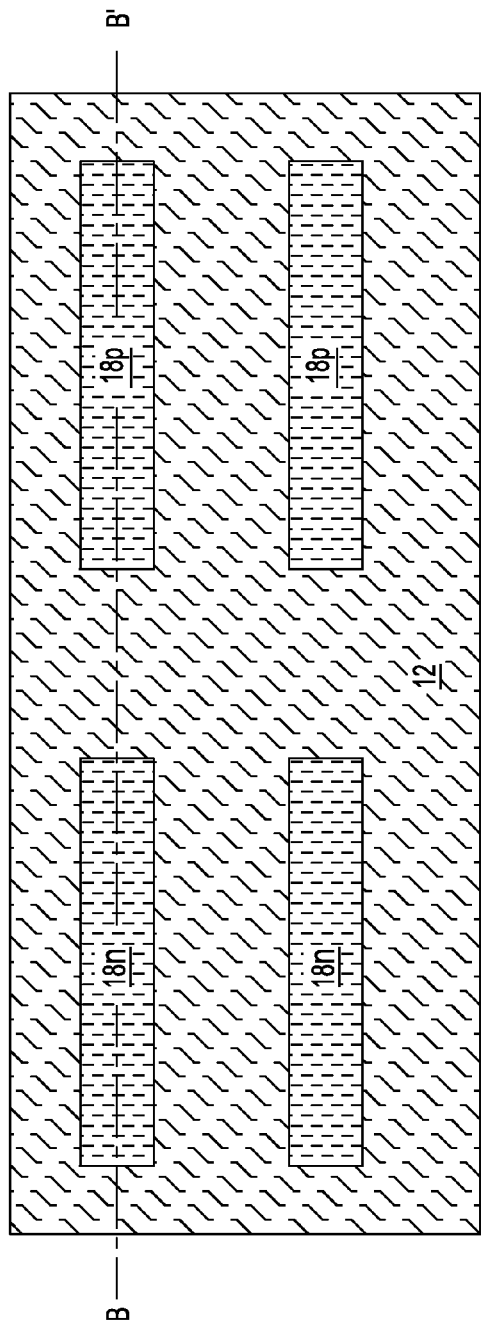
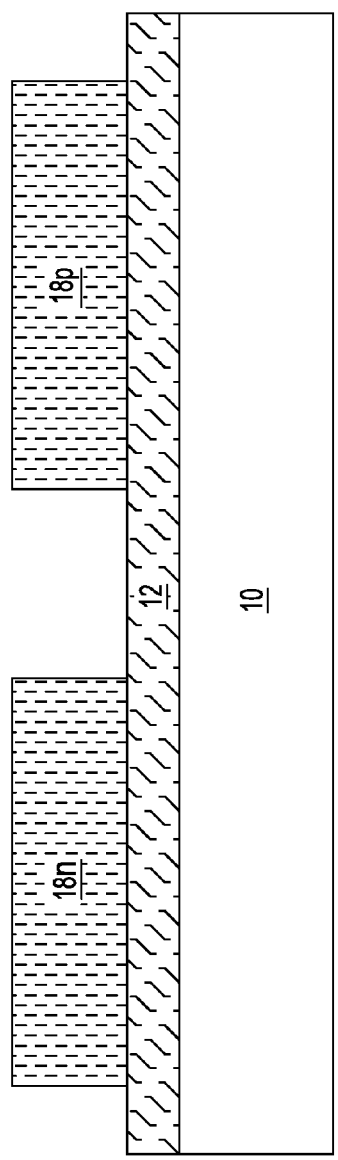
FIG. 2A
FIG. 2B

STRUCTURE AND METHOD TO FORM LINER SILICIDE WITH IMPROVED CONTACT RESISTANCE AND RELIABLITY

BACKGROUND

The present application relates to semiconductor structures and methods of fabricating the same, and more particularly to contact structures with improved contact resistance and reliability and methods of forming the same.

Field Effect Transistors (FETs) are essential components of all modern electronic products. Generally, after a transistor is formed, electrical contacts are made to connect a source region, a drain region, and/or a gate region of the transistor to make the transistor fully functional. Typically, lithographic techniques are used to define contact openings in a dielectric material that surrounds the transistor for the electrical contacts. The contact openings are then filled with a metal filler to form electrical contacts. As FETs are scaled to smaller dimensions, increased contact resistance to the source region and the drain region (hereinafter collectively referred to as "source/drain regions") jeopardizes device performance, especially for the 32 nm technology node and beyond. A liner silicide has been employed to reduce the contact resistance between the metal filler and the source/drain regions. For example, a NiPt silicide liner has been shown to provide good on-resistance ($R_{on}$) for both n-type FETs (nFETs) and p-type FETs (PFETs). However, since the NiPt liner from which the NiPt silicide liner is derived is not removed from sidewalls of the contact openings, Ni diffusion into the dielectric material surrounding the contact openings raises liability concerns. Therefore, there remains a need to develop contact structures with improved contact resistance and reliability.

SUMMARY

The present disclosure provides a contact structure with improved contact resistance and reliability. In one embodiment of the present application, this can be achieved by forming an inner spacer between a contact liner and dielectric layers laterally surrounding the contact structure. The inner spacer severs as a barrier to prevent diffusion of metals from the contact liner into the dielectric layers and it also mitigates on-resistance ($R_{on}$) degradation.

In one aspect of the present application, a method of forming a semiconductor structure is provided. The method includes first forming a plurality of contact openings through a contact level dielectric layer and a portion of an interlevel dielectric (ILD) layer. The plurality of contact openings expose portions of an epitaxial source region and an epitaxial drain region of at least one semiconductor device. After forming an inner spacer on each sidewall of the plurality of contact openings, a contact liner material layer is formed on the inner spacer and bottom surfaces of the plurality of contact openings. The bottom portions of the liner material layer in the plurality of contact openings react with exposed portions of the epitaxial source region and the epitaxial drain region to form liner silicide portions. Next, a contact conductor layer is formed to fill remaining volumes of the plurality of contact openings.

In another aspect of the present application, a semiconductor structure is provided. The semiconductor structure includes at least one semiconductor device. The at least one semiconductor device includes a functional gate structure and an epitaxial source region and an epitaxial drain region located on opposite sides of the functional gate structure. The function gate structure, the epitaxial source region and the epitaxial drain region are laterally surrounded by an interlevel dielectric (ILD) layer. The semiconductor structure further includes a plurality of source/drain contact structures extending through a contact level dielectric layer and a portion of the ILD layer and in contact with portions of the epitaxial source region and the epitaxial drain region. Each of the plurality of source/drain contact structures includes an inner spacer located on sidewalls of each of a plurality of source/drain contact openings that is laterally surrounded by the contact level dielectric layer and the portion of the ILD layer, a contact liner having a first portion in contact with the inner spacer and a second portion in contact with the portions of the epitaxial source and drain regions, and a contact conductor filling in a remaining volume of each of the plurality of source/drain contact openings.

BRIEF DESCRIPTION OF THE DRAWINGS

FIG. 1A is a top-down view of an exemplary semiconductor structure after forming a plurality of fin-defining mask structures in an nFinFET region and a pFinFET region on a semiconductor substrate according to one embodiment of the present application.

FIG. 1B is a cross-sectional view of the exemplary semiconductor structure of FIG. 1A along line B-B'.

FIG. 2A is a top-down view of the exemplary semiconductor structure of FIG. 1A after patterning a top semiconductor layer of the semiconductor substrate to form a plurality of semiconductor fins in the nFinFET region and the pFinFET region.

FIG. 2B is a cross-sectional view of the exemplary semiconductor structure of FIG. 2A along line B-B'.

DETAILED DESCRIPTION

Figure 3:
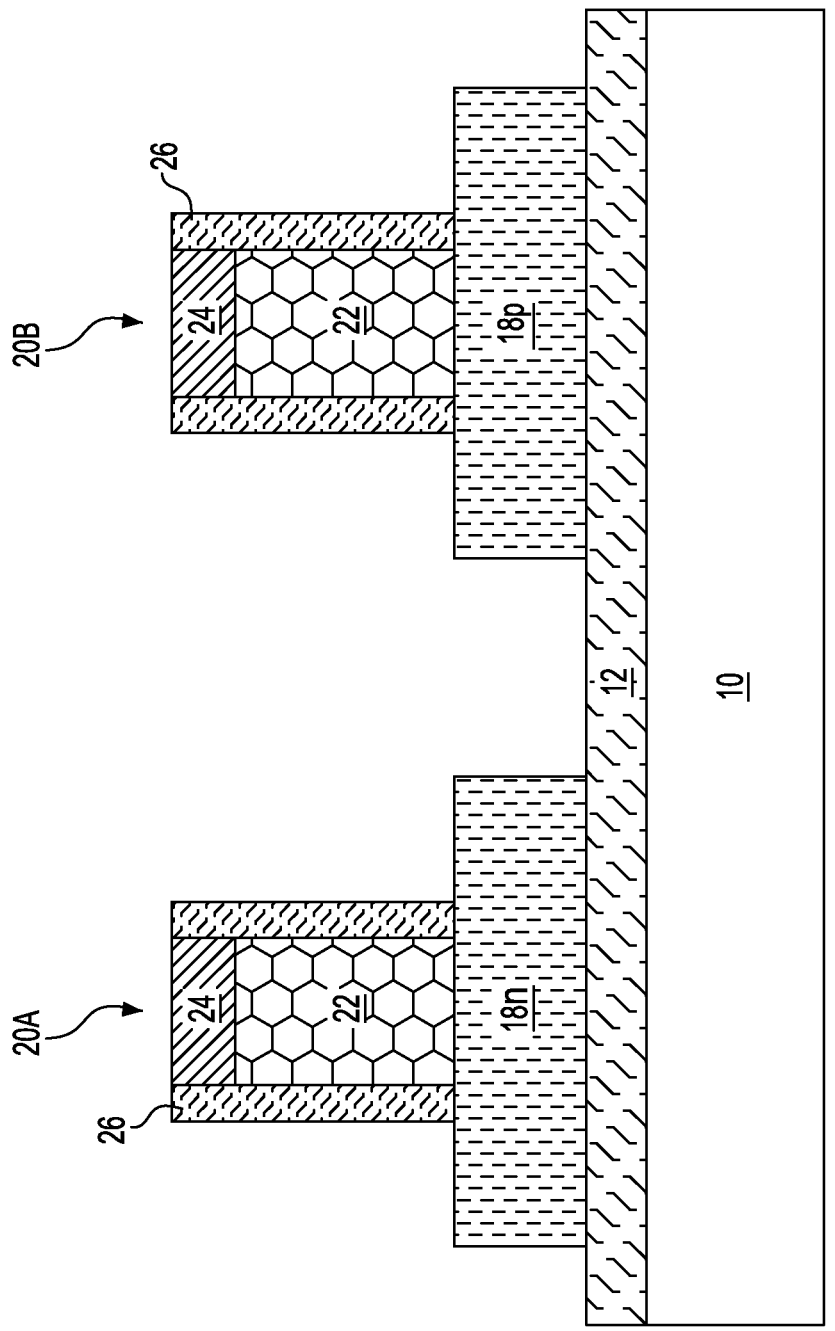
FIG. 3 is a cross-sectional view of the exemplary semiconductor structure of FIGS. 2A-2B after forming a first sacrificial gate structure over a portion of each of the semiconductor fins in the nFinFET region and a second sacrificial gate structure over a portion of each of the semiconductor fins in the pFinFET region.

The present application will now be described in greater detail by referring to the following discussion and drawings that accompany the present disclosure. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present application may be practiced without these specific details. In other instances, well-known structures or processing steps have not been described in detail in order to avoid obscuring the present application.

Referring to FIGS. 1A and 1B, an exemplary semiconductor structure that can be employed according to an embodiment of the present application is provided. The exemplary semiconductor structure includes a semiconductor substrate 8 and a plurality of fin-defining mask structures 16A, 16B formed thereon. The semiconductor substrate 8 can be a bulk substrate including a bulk semiconductor material throughout or a semiconductor-on-insulator (SOI) substrate. In one embodiment and as shown in FIG. 1B, the semiconductor substrate 8 is an SOI substrate including a handle substrate 10, a buried insulator layer 12 and a top semiconductor layer 14.

In some embodiments of the present disclosure, the handle substrate 10 can include a semiconductor material, such as, for example, Si, Ge, SiGe, SiC, SiGeC, and III/V compound semiconductors. The handle substrate 10 provides mechanical support to the buried insulator layer 12 and the top semiconductor layer 14. The thickness of the handle substrate 10 can be from 30 µm to about 2 mm, although less and greater thicknesses can also be employed.

The buried insulator layer 12 includes a dielectric material such as silicon oxide, silicon nitride, silicon oxynitride, or a combination thereof. The thickness of the buried insulator layer 12 can be from 50 nm to 200 nm, with a thickness from 100 nm to 150 nm being more typical.

The top semiconductor layer 14 can include a semiconductor material such as, for example, Si, Ge, SiGe, SiC, SiGeC, and III/V compound semiconductors such as, for example, InAs, GaAs, and InP. The semiconductor materials of the top semiconductor layer 14 and the handle substrate 10 may be the same or different. Typically, each of the handle substrate 10 and the top semiconductor layer 14 comprises a single crystalline semiconductor material, such as, for example, single crystalline silicon. The top semiconductor layer 14 may or may not be doped with p-type dopants and/or n-type dopants. Examples of p-type dopants include, but are not limited to, boron, aluminum, gallium and indium. Examples of n-type dopants include, but are not limited to, antimony, arsenic and phosphorous. The thickness of the top semiconductor layer 14 can be from 10 nm to 200 nm, with a thickness from 30 nm to 70 nm being more typical.

A first plurality of fin-defining mask structures 16A is formed in a first device region 100, and a second plurality of fin-defining mask structure 16B is formed in a second device region 200. In the drawing and by way of illustration, the first device region 100 defines an nFinFET region, whereas the second device region 200 defines a pFinFET region. The fin-defining mask structures 16A,16B are mask structures that cover the regions of the top semiconductor layer 14 that are subsequently converted into semiconductor fins. The fin-defining mask structures 16A, 16B can include a dielectric material such as, for example, silicon nitride, silicon oxide, or silicon oxynitride.

The fin-defining mask structures 16A, 16B can be formed, for example, by first depositing a blanket hard mask layer (not shown) on the top semiconductor layer 14. The hard mask layer can be deposited, for example, by chemical vapor deposition (CVD). The thickness of the hard mask layer can be from 5 nm to 100 nm, although lesser and greater thicknesses can also be employed.

The hard mask layer can be subsequently patterned to form the fin-defining mask structures 16A, 16B by lithography and etching processes. The lithographic step includes applying a photoresist layer (not shown) atop the hard mask layer, exposing the photoresist layer to a desired pattern of radiation, and developing the exposed photoresist layer utilizing a conventional resist developer. The etching process comprises dry etching and/or wet chemical etching.

Illustrative examples of suitable dry etching processes that can be used in the present disclosure include reactive ion etch (RIE), ion beam etching, plasma etching or laser ablation. Typically, a RIE process is used. The etching process transfers the pattern from the patterned photoresist layer to the hard mask layer, utilizing the top semiconductor layer 14 as an etch stop. After transferring the pattern into the hard mask layer, the patterned photoresist layer can be removed utilizing a conventional resist stripping process such as, for example, ashing.

In one embodiment and as shown in FIG. 1B, the fin-defining mask structures 16A, 16B that are formed in each of the first device region 100 (i.e., nFinFET region) and the second device region 200 (i.e., pFinFET region) are arranged in parallel and spaced apart in a widthwise direction with each fin-defining mask structure laterally extends along a lengthwise direction.

Referring to FIGS. 2A and 2B, the top semiconductor layer 14 is patterned to form a plurality of semiconductor fins 18n, 18p in the nFinFET region and pFinFET region using fin-defining mask structures 16A, 16B as an etch mask. Portions of the top semiconductor layer 14 that are not protected by the fin-defining mask structures 16A, 16B are removed, for example, using RIE. Remaining non-etched portions of the top semiconductor layer 14 in the nFinFET region are herein referred to as n-type semiconductor fins 18n, while remaining non-etched portions of the top semiconductor layer 14 in the pFinFET region are herein referred to as p-type semiconductor fins 18p.

Each of the semiconductor fins 18n, 18p that is formed may have a height ranging from 1 nm to 150 nm, with a height ranging from 10 nm to 50 nm being more typical. Each of the semiconductor fins 18n, 18p may have a width ranging from 5 nm to 40 nm, with a width ranging from 10 nm to 20 nm being more typical. Adjacent semiconductor fins 18n, 18p may be separated by a pitch ranging from 20 nm to 100 nm, with a pitch ranging from 30 nm to 50 nm being more typical.

The fin-defining mask structures 16A, 16B can be subsequently removed selective to the semiconductor fins 18n, 18p. The removal of the fin-defining mask structures 16A, 16B can be effected by an etch, which can be a wet etch or a dry etch. In one embodiment, the fin-defining mask structures 16A, 16B can be removed by a wet etch. For example, a wet etch employing hot phosphoric acid can be employed to remove silicon nitride, while a wet etch employing hydrofluoric acid can be employed to remove silicon oxide.

Referring to FIG. 3, sacrificial gate structures including a first sacrificial gate structure 20A formed over a portion of each of the semiconductor fins 18n in the nFinFET region and a second sacrificial gate structure 20B formed over a portion of each of the semiconductor fins 18p in the pFinFET region are provided. The first sacrificial gate structure 20A straddles the semiconductor fins 18n in the nFinFET region, while the second sacrificial gate structure 20B straddles the semiconductor fins 18p in the pFinFET region. The term "sacrificial gate structure" as used herein refers to a placeholder structure for a functional gate structure to be subsequently formed. The "functional gate structure" as used herein refers to a permanent gate structure used to control output current (i.e., flow of carriers in the channel) of a semiconducting device through electrical fields. Although only one sacrificial gate structure is described and illustrated in each of the nFinFET region and the pFinFET region, the present disclosure is not limited to such a number of sacrificial gate structures. Instead, a plurality of sacrificial gate structures can be formed in each of the nFinFET region and the pFinFET region.

Each of the sacrificial gate structures 20A, 20B includes a sacrificial gate stack and a gate spacer 26 formed on sidewalls of the corresponding sacrificial gate stack. Each sacrificial gate stack includes, from bottom to top, a sacrificial gate material 22 and a sacrificial gate cap 24 and can be formed by first providing a material stack of a sacrificial gate material layer and a sacrificial gate cap layer (not shown) over the semiconductor fins 18n, 18p and the substrate (i.e., the buried insulator layer 12 and the handle substrate 10). In some embodiments not shown, a sacrificial gate dielectric (such as silicon dioxide) can be employed and formed prior to forming the sacrificial gate material layer.

The sacrificial gate material layer may be composed of a semiconductor material that can be etched selectively to a material of the semiconductor fins 18n, 18p. Exemplary semiconductor materials that can be employed in the sacrificial gate material layer include, but are not limited to, silicon, germanium, a silicon germanium alloy, a silicon carbon alloy, or a compound semiconductor material. In one embodiment, the sacrificial gate material layer is composed of polysilicon. The sacrificial gate material layer can be formed using CVD or plasma enhanced chemical vapor deposition (PECVD). The thickness of the sacrificial gate material layer, as measured above an upper surface of the semiconductor fins 18n, 18p, can be from 50 nm to 300 nm, although lesser and greater thicknesses can also be employed.

The sacrificial gate cap layer can include a dielectric material such as, for example, silicon oxide, silicon nitride, or silicon oxynitride. The sacrificial gate cap layer can be formed by a deposition process including, for example, CVD, PECVD, physical vapor deposition (PVD), atomic layer deposition (ALD) or sputtering. The sacrificial gate cap layer that is formed can have a thickness ranging from 25 nm to 100 nm, although lesser or greater thicknesses can also be employed.

The material stack can then be patterned by lithography and etching to form the sacrificial gate stacks (22, 24) in each of the sacrificial gate structure 20A, 20B. Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as a RIE process. The remaining portions of the material stack after the pattern transfer constitute sacrificial gate stacks (22, 24).

Each gate spacer 26 can be formed by first depositing a conformal spacer material layer (not shown) on exposed surfaces of the sacrificial gate stacks (22, 24) and the semiconductor fins 18n, 18p utilizing a conventional deposition process including, for example, CVD or ALD. Alternatively, a thermal growth process including oxidation and/or nitridation can be employed in forming the spacer material layer. Following the formation of the spacer material layer, horizontal portions of the spacer material layer are removed by an anisotropic etch, such as, for example, a RIE process. In one embodiment, the RIE process is continued so that vertical portions of the spacer material layer present on the sidewalls of the semiconductor fins 18n, 18p are removed. The remaining vertical portions of the spacer material layer constitute the gate spacer 26.

Materials used to form the gate spacer 26 may include a dielectric material such as, for example, silicon oxide, silicon nitride, or silicon oxynitride. The gate spacer 26 can have a thickness as measured at the bases ranging from 2 nm to 100 nm, with a thickness ranging from 6 nm to 10 nm being more typical.

Figure 4:
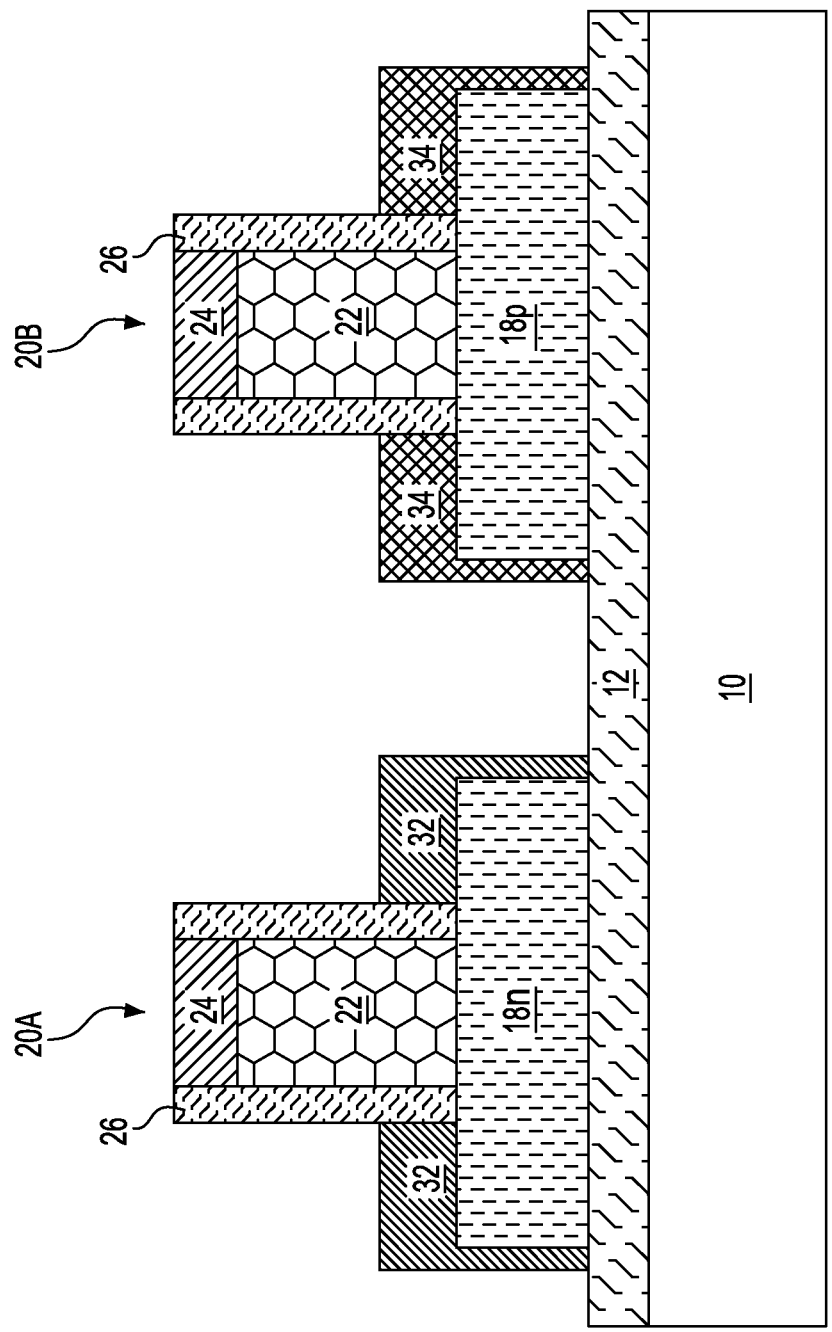
FIG. 4 is a cross-sectional view of the exemplary semiconductor structure of FIG. 3 after forming a first source region and a first drain region on opposite sides of the first sacrificial gate structure in the nFinFET region and a second source region and a second drain region on opposite sides of the second sacrificial gate structure in the pFinFET region.

Referring to FIG. 4, a first source region and a first drain region (collectively referred to as first source/drain regions 32) are formed on opposite sides of the first sacrificial gate structure 20A in the nFinFET region and a second source region and a second drain region (collectively referred to as second source/drain regions 34) are formed on opposite sides of the second sacrificial gate structure 20B in the pFinFET region.

The first source/drain regions 32 and the second source/drain regions 34 can be formed by utilizing block mask technology. A first mask layer (not shown) is first applied over the semiconductor fins 18n, 18p, the sacrificial gate structures 20A, 20B, and the substrate and lithographically patterned so that the patterned first mask layer covers the pFinFET region, while exposing the nFinFET region that would be subjected to the epitaxial deposition and ion implantation. The first mask layer may include any material that can be easily patterned and removed without damaging the underlying components. In one embodiment, the first mask layer includes amorphous carbon with hydrogen content less than about 15 atomic %. The first source/drain regions 32 can be formed by epitaxially depositing a first semiconductor material over the exposed surfaces of semiconductor fins 18n, but not on dielectric surfaces such as the surfaces of the sacrificial gate cap 24, the gate spacer 26 and the buried insulator layer 12. In one embodiment, the first source/drain regions 32 is composed of SiC with the strain effect tuned to enhance the performance of nFinFETs formed in the nFinFET region.

The first semiconductor material of the first source/drain regions 32 can be deposited as an intrinsic semiconductor material, or can be deposited with in-situ doping. If the first semiconductor material is deposited as an intrinsic semiconductor material, the first source/drain regions 32 can be subsequently doped (ex-situ) with an n-type dopant (e.g., P, As or Sb) utilizing ion implantation, gas phase doping, or dopant out diffusion from a sacrificial dopant source material. After the formation of the first source/drain regions 32, the patterned mask layer can be removed, for example, by oxygen-based plasma etching.

The second source/drain regions 34 can be formed by performing the processing steps described above with respect to the first source/drain regions 32. After forming a patterned second mask layer to cover the nFinFET region and expose the pFinFET region, a second semiconductor material is epitaxially deposited over the exposed surfaces of semiconductor fins 18p, but not on dielectric surfaces such as the surfaces of the sacrificial gate cap 24, the gate spacer 26 and the buried insulator layer 12. In one embodiment, the second semiconductor material is SiGe with the strain effect tuned to enhance the performance of pFinFETs formed in the pFinFET region.

The second semiconductor material of the second source/drain regions 34 can be deposited as an intrinsic semiconductor material, or can be deposited with in-situ doping. If the second semiconductor material is deposited as an intrinsic semiconductor material, the second source/drain regions 32 can be subsequently doped (ex-situ) with a p-type dopant (e.g., B, Al, Ga or In) utilizing ion implantation, gas phase doping or dopant out diffusion from a sacrificial dopant source material. After the formation of the second source/drain regions 32, the patterned second mask layer can be removed, for example, by oxygen-based plasma etching.

The n-type dopants in the first source/drain regions 32 and p-type dopants in the second source/drain regions 34 can be activated subsequently using a rapid thermal process.

Figure 5:
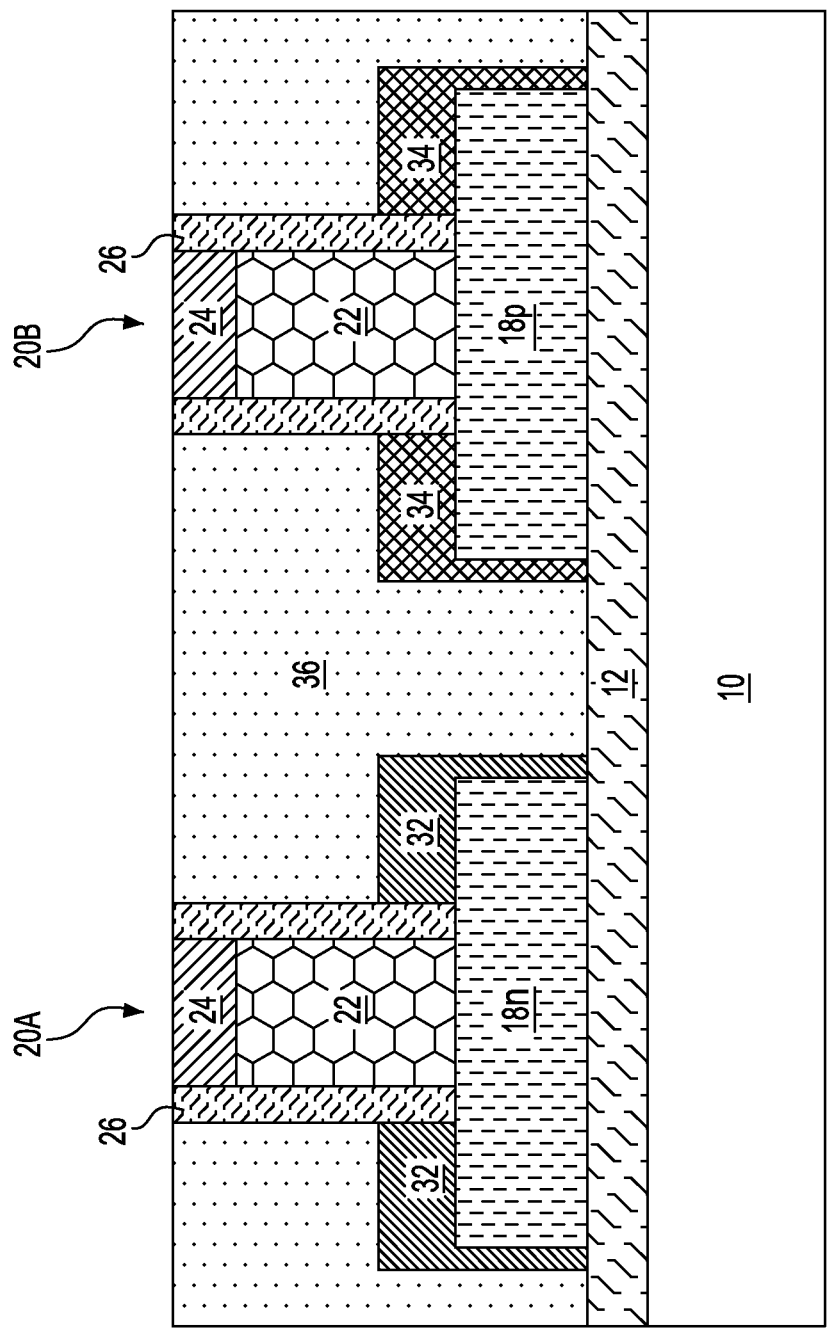
FIG. 5 is a cross-sectional view of the exemplary semiconductor structure of FIG. 4 after forming an interlevel dielectric (ILD) layer over the first and second sacrificial gate structures, the first and second source/drain regions, and a substrate including a buried insulator layer and a handle substrate.

Referring to FIG. 5, an interlevel dielectric (ILD) layer 36 is formed over the substrate, covering the first sacrificial gate structure 20A, the second sacrificial gate structure 20B, the first source/drain regions 32, the second source/drain regions 34, and the exposed portions of the buried insulator layer 12. The ILD layer 36 includes a dielectric material that may be easily planarized. For example, the ILD layer 36 can be a doped silicate glass, an undoped silicate glass (silicon oxide), an organosilicate glass (OSG), or a porous dielectric material. The ILD layer 36 can be formed by CVD, PVD or spin coating. The thickness of the ILD layer 36 can be selected so that an entirety of the top surface of the ILD layer 36 is formed above top surfaces of the sacrificial gate cap 24. The ILD layer 36 can be subsequently planarized, for example, by CMP and/or a recess etch. In one embodiment, the sacrificial gate cap 24 can be employed as an etch stop. After the planarization, the ILD layer 36 has a topmost surface coplanar with the top surfaces of the sacrificial gate cap 24.

Figure 6:
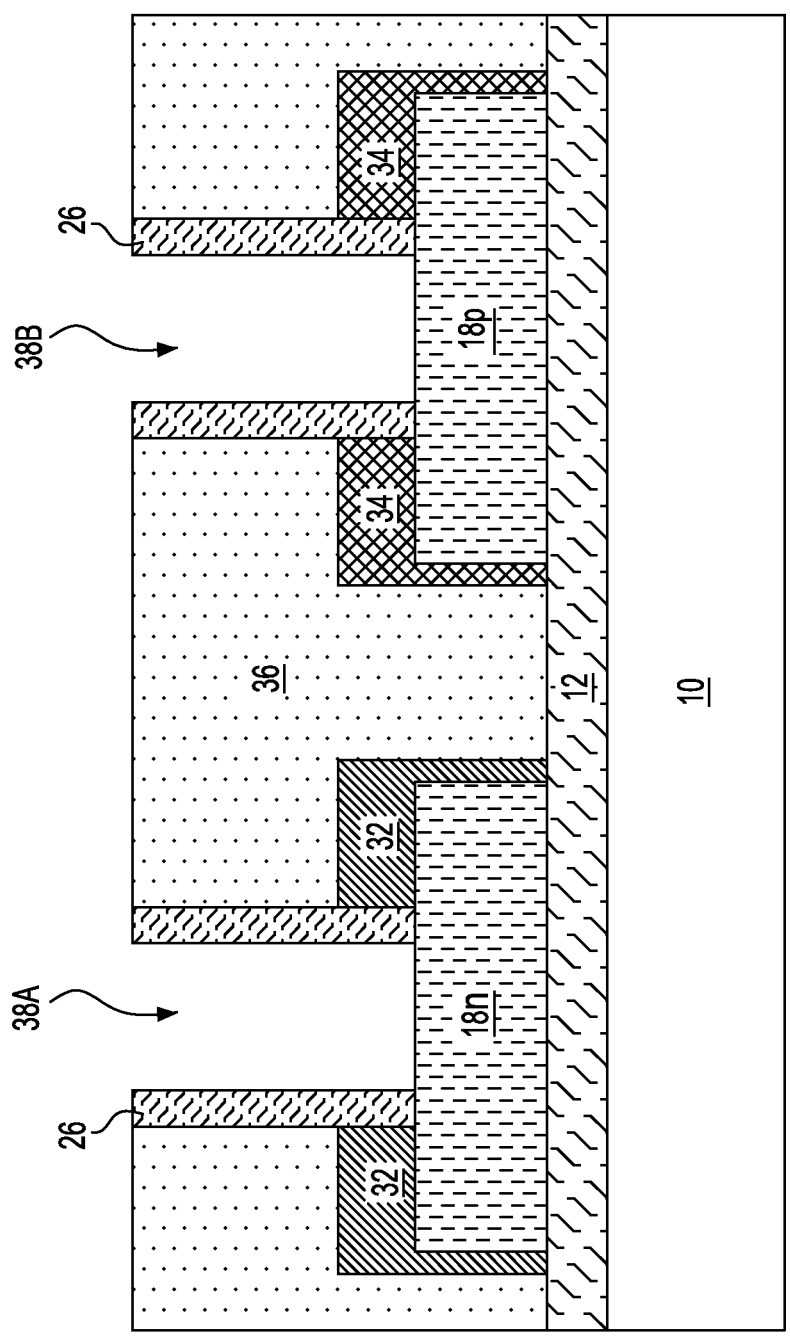
FIG. 6. is a cross-sectional view of the exemplary semiconductor structure of FIG. 5 after forming a first gate cavity in the nFinFET region and a second gate cavity in the pFinFET region.

Referring to FIG. 6, the sacrificial gate stacks (22, 24) in the first and the second sacrificial gate structures 20A, 20B can be removed by at least one etch, which can be a dry etch and/or a wet etch. The at least one etch employed to remove the sacrificial gate stacks (22, 24) is selective to the dielectric materials of the ILD layer 36 and the gate spacer 26 as well as the semiconductor material of the semiconductor fins 18n, 18p. A first gate cavity 38A is formed in the nFinFET region. The first gate cavity 38A occupies a volume from which the sacrificial gate stack (22, 24) in the first sacrificial gate structure 20A is removed. A second gate cavity 38B is formed in the pFinFET region. The second gate cavity 38B occupies a volume from which the sacrificial gate stack (22, 24) in the second sacrificial gate structure 20B is removed.

Figure 7:
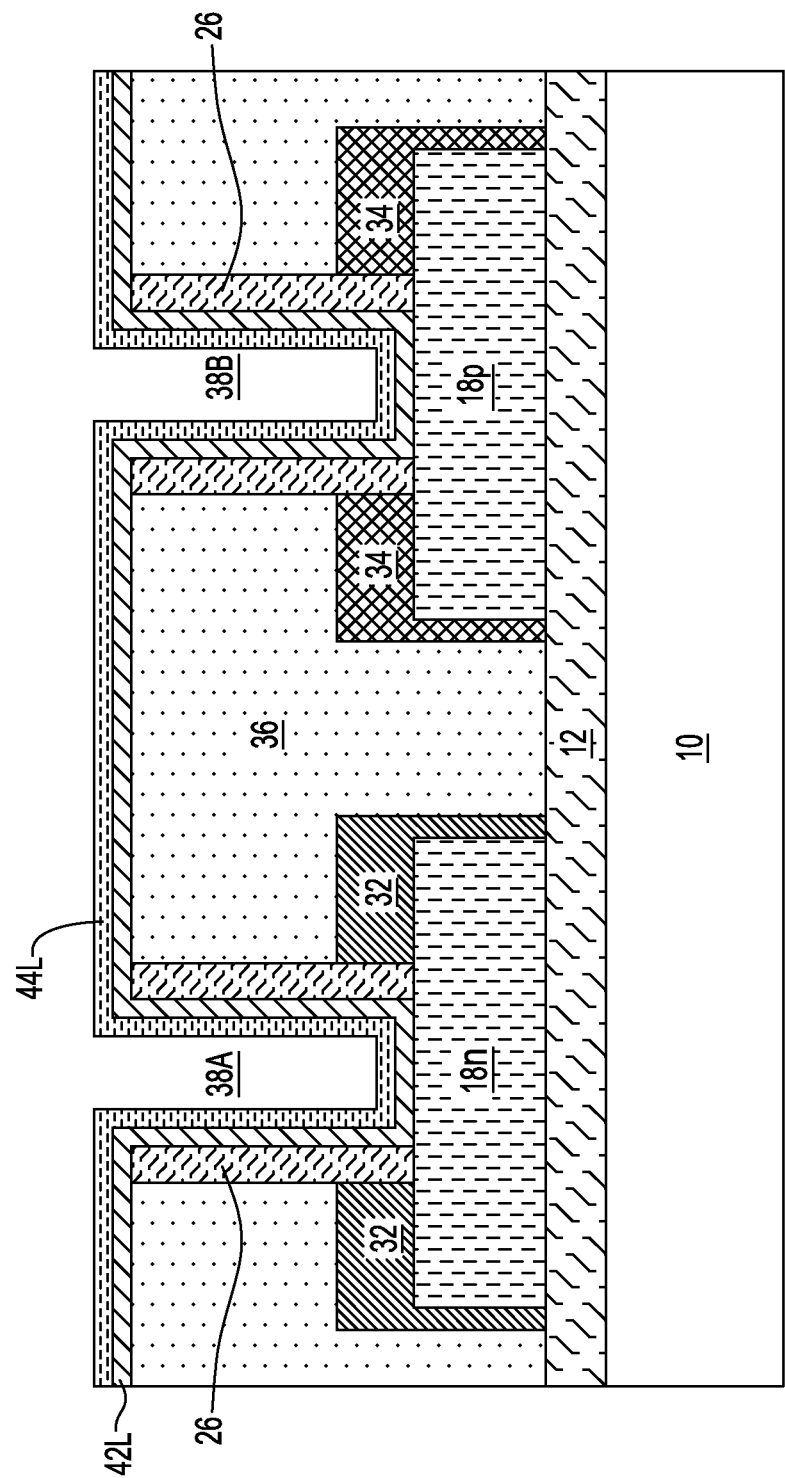
FIG. 7 is a cross-sectional view of the exemplary semiconductor structure of FIG. 6 after forming a gate dielectric layer on bottom surfaces and sidewalls of the first and second gate cavities and a topmost surface of the ILD layer and a first work function material layer over the gate dielectric layer.

Referring to FIG. 7, a conformal gate dielectric layer 42L is deposited on the bottom surfaces and sidewalls of the gate cavities 38A, 38B and the topmost surface of the ILD layer 36. The gate dielectric layer 42L can be a high dielectric constant (high-k) material layer having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In one embodiment, the gate dielectric layer 42L is a hafnium oxide ($HfO_2$) layer. The gate dielectric layer 42L can be formed by a conventional deposition process, including but not limited to, CVD, PVD, ALD, molecular beam epitaxy (MBE), ion beam deposition, electron beam deposition, and laser assisted deposition. The gate dielectric layer 42L that is formed may have a thickness ranging from 0.9 nm to 6 nm, with a thickness ranging from 1.0 nm to 3 nm being more typical. The gate dielectric layer 42L may have an effective oxide thickness on the order of or less than 1 nm.

A conformal first work function material layer 44L is subsequently formed over the gate dielectric layer 42L employing CVD, sputtering or plating. The first work function material layer 44L includes a first metal having a first work function suitable to tune the work function of nFinFETs in the nFinFET region. Exemplary first metals that can be employed in the first work function material layer 44L include, but are not limited to La, Ti and Ta. The thickness of the first work function material layer 44L can be from 3 nm to 15 nm, although lesser and greater thicknesses can also be employed.

Figure 8:
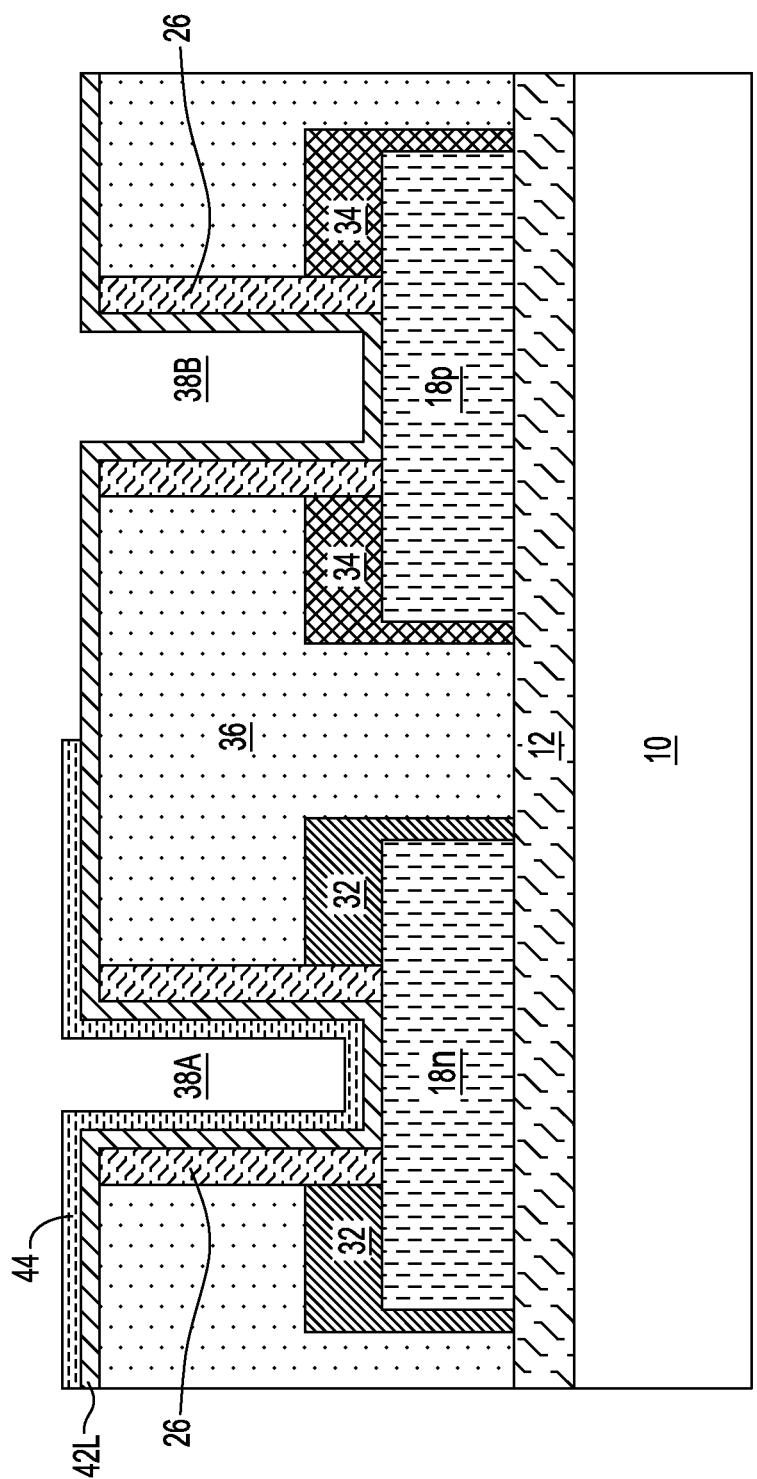
FIG. 8 is a cross-sectional view of the exemplary semiconductor structure of FIG. 7 after removing a portion of the first work function material layer from the pFinFET region.

Referring to FIG. 8, a portion of the first work function material layer 44L is removed from the pFinFET region. A mask layer (not shown) is applied and lithographically patterned so that a patterned mask layer (not shown) covers the nFinFET region, while exposing a portion of the first work function material layer 44L in the pFinFET region. The exposed portion of the first work function material layer 44L is removed by an etch, which can be a wet etch or a dry etch. Removal of the exposed portion of the first work function material layer 44L exposes a portion of the gate dielectric layer 42L in the pFinFET region. The patterned mask layer can then be removed, for example, by oxygen-based plasma etching. The remaining portion of the first work function material layer 44L in the nFinFET is herein referred to as a first work function material layer portion 44.

Figure 9:
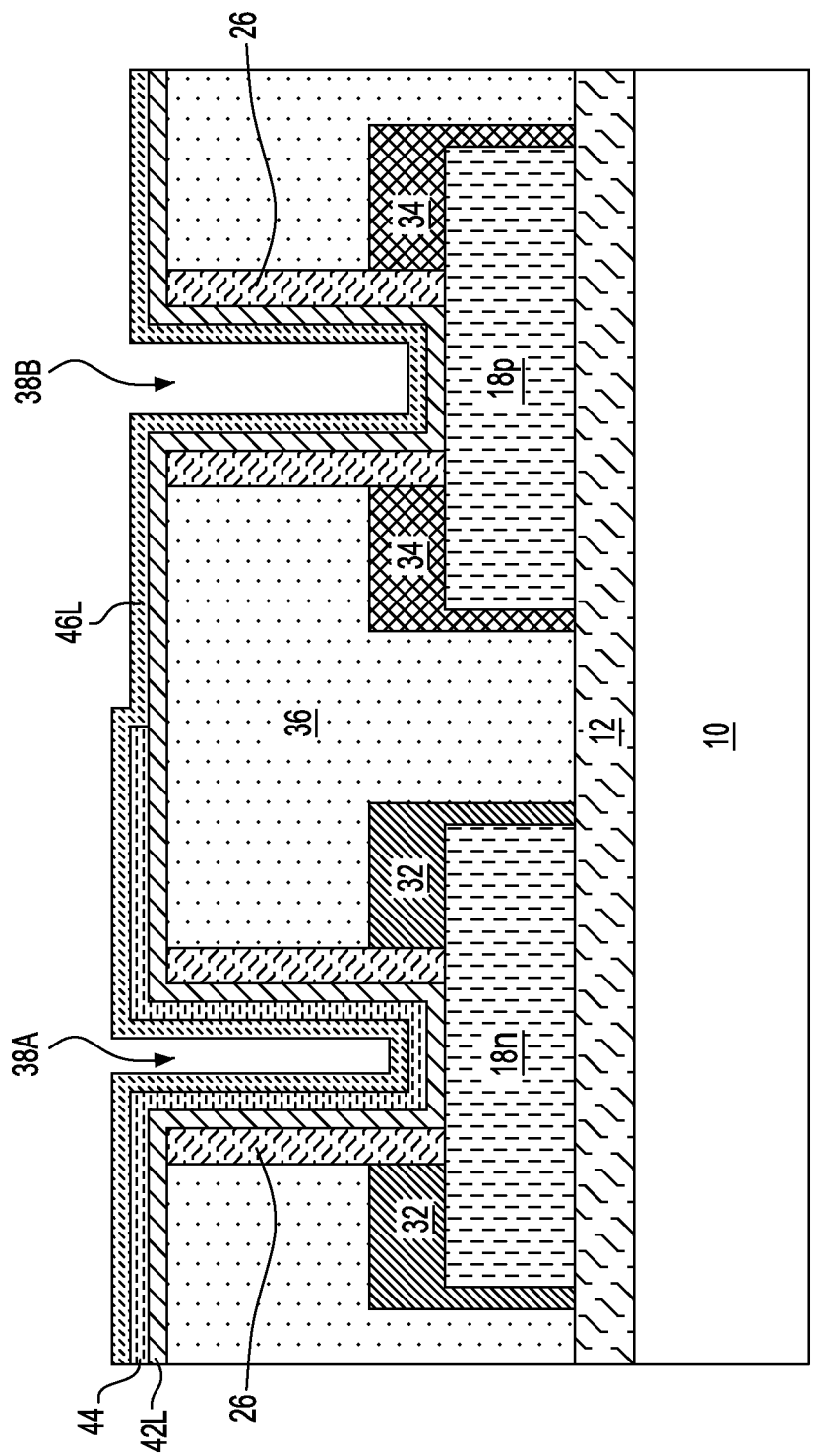
FIG. 9 is a cross-sectional view of the exemplary semiconductor structure of FIG. 8 after forming a second work function material layer over an exposed portion of the gate dielectric layer and a remaining portion of the first work function material layer.

Referring to FIG. 9, a conformal second work function material layer 46L is formed over the exposed portion of the gate dielectric layer 42L and the first work function material layer portion 44 employing CVD, sputtering or plating. The second work function material layer 46L includes a second metal having a second work function suitable to tune the work function of pFinFETs in pFinFET region. Exemplary second metals that can be employed in the second work function material layer 46L include, but are not limited to Al, TiN, TaN and WN. The thickness of the second work function material layer 46L can be from 3 nm to 15 nm, although lesser and greater thicknesses can also be employed.

Figure 10:
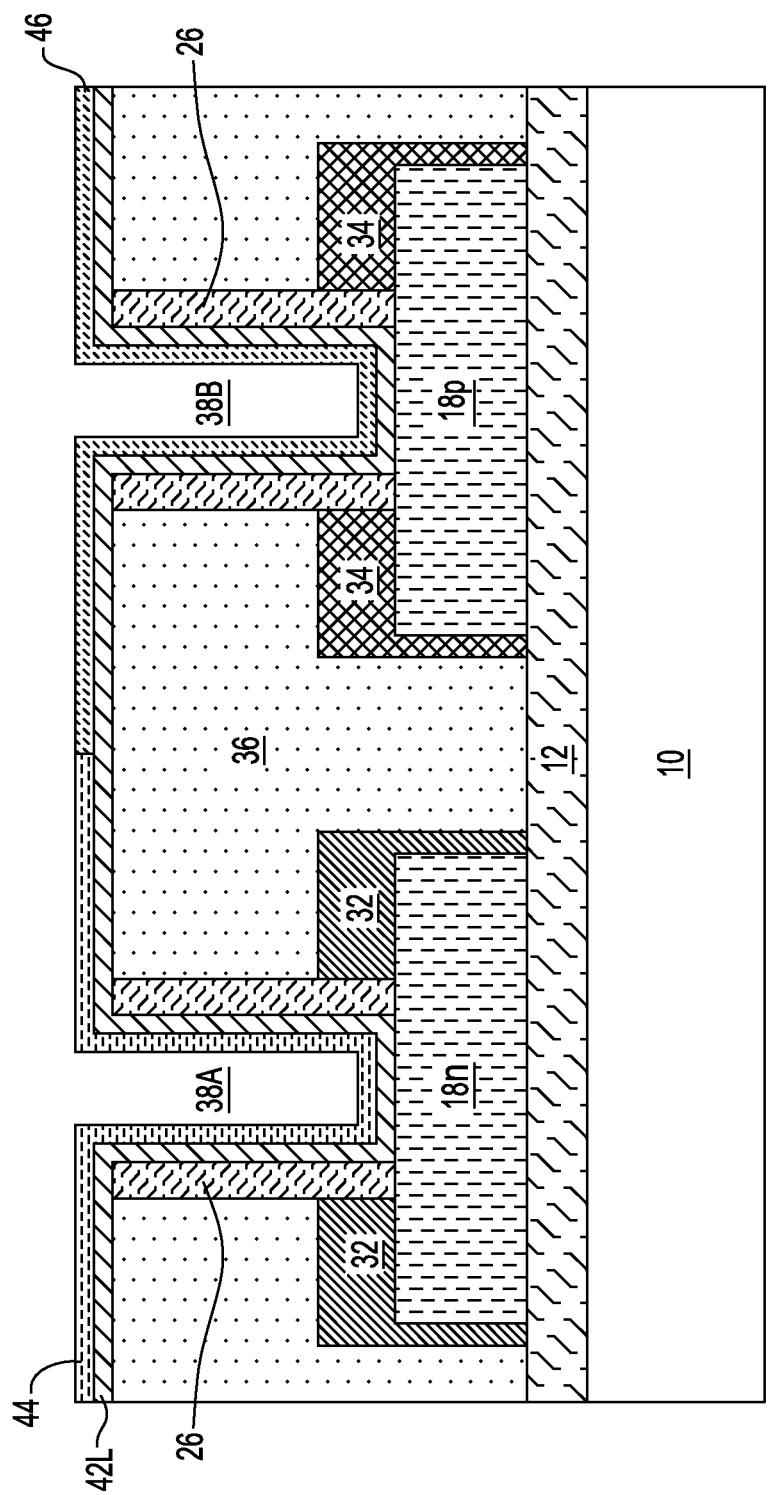
FIG. 10 is a cross-sectional view of the exemplary semiconductor structure of FIG. 9 after removing a portion of the second work function material layer from the nFinFET region.

Referring to FIG. 10, a portion of the second work function material layer 46L is removed from the nFinFET region. A mask layer (not shown) is applied and lithographically patterned so that a patterned mask layer (not shown) covers the pFinFET region, while exposing a portion of the second work function material layer 46L in the nFinFET region. The exposed portion of the second work function material layer 46L is removed by an etch, which can be a wet etch or a dry etch. The patterned mask layer can then be removed, for example, by oxygen-based plasma etching. The remaining portion of the second work function material layer 46L in the pFinFET region is herein referred to as a second work function material layer portion 46.

Figure 11:
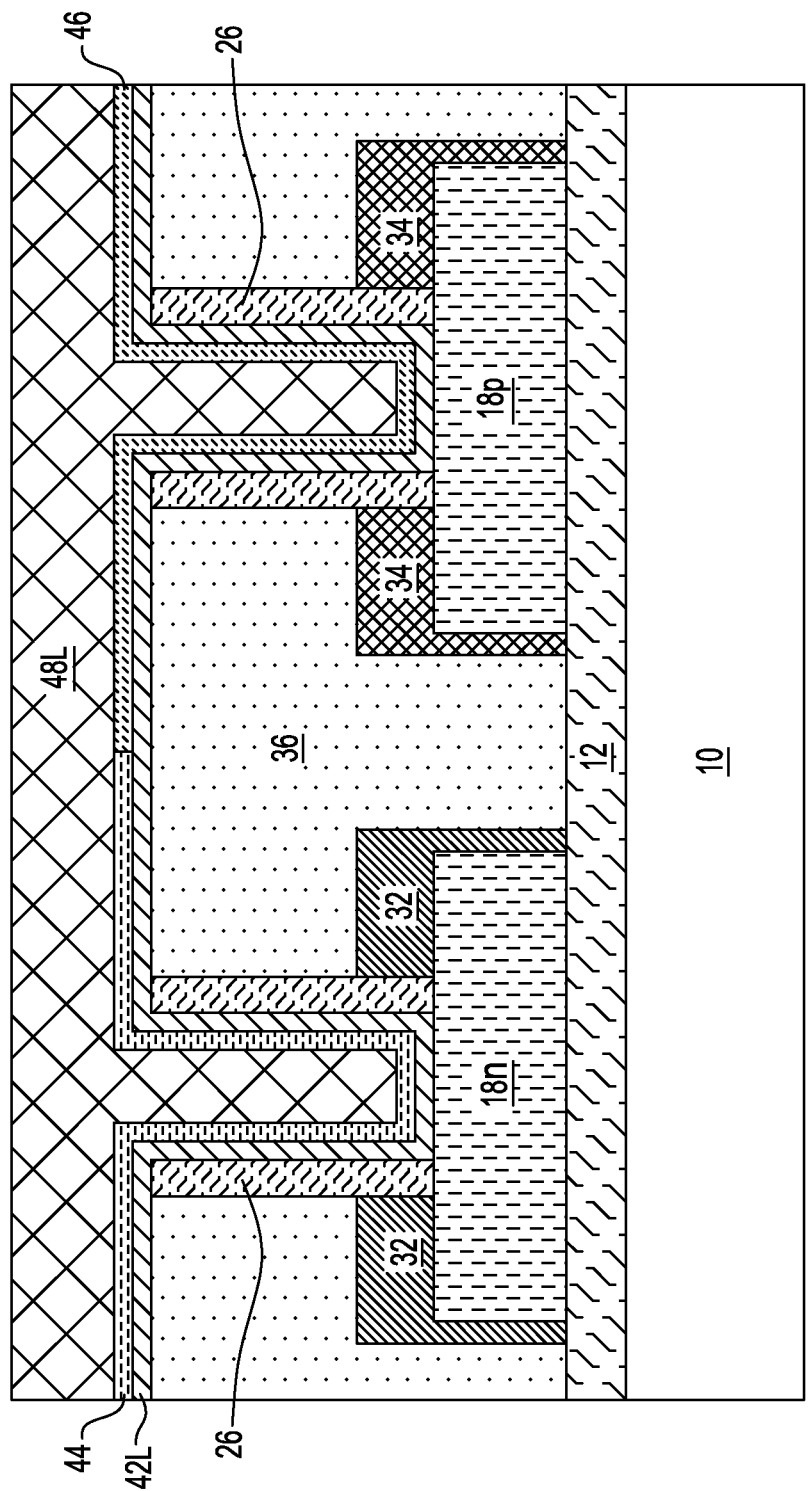
FIG. 11 is a cross-sectional view of the exemplary semiconductor structure of FIG. 10 after filling remaining volumes of the first and second gate cavities with a gate electrode material layer.

Referring to FIG. 11, remaining volumes of the gate cavities 38A, 38B are filled with a gate electrode material layer 48L. The gate electrode material layer 48L can includes any conductive material including, for example, doped polysilicon, Al, Au, Ag, Cu or W. The gate electrode material layer 48L can be formed by a conventional deposition process such as, for example, CVD, PVD and ALD. The thickness of the gate electrode material layer 48L, as measured in a planar region of the gate electrode material layer 48L above the topmost surface of the ILD layer 36, can be from 100 nm to 500 nm.

Figure 12:
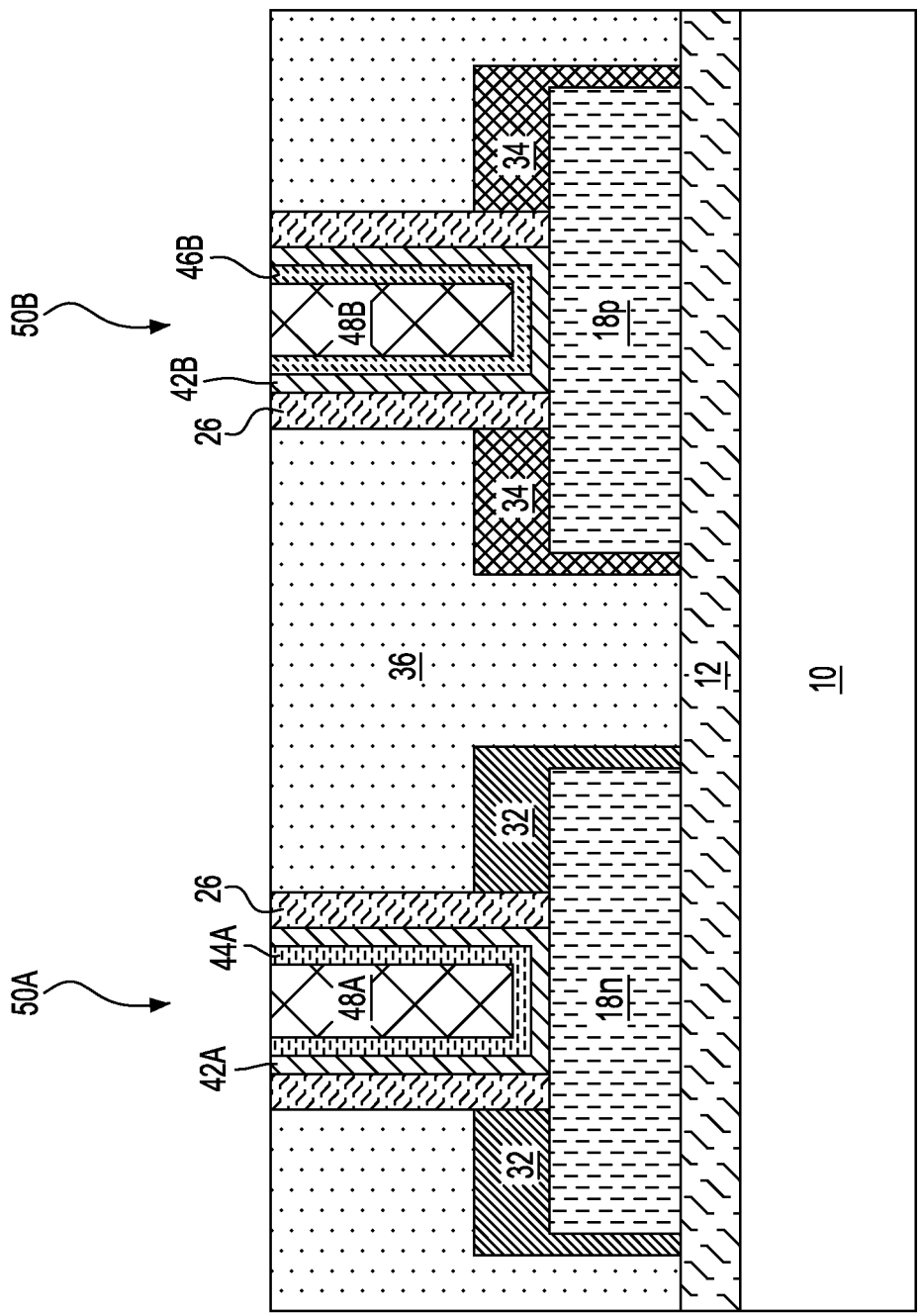
FIG. 12 is a cross-sectional view of the exemplary semiconductor structure of FIG. 11 after removing portions of the gate electrode material layer, the first work function material layer portion, the second work function material layer portion and the gate dielectric layer that are located above the topmost surface of the ILD layer to provide a first functional gate stack in the nFinFET region and a second functional gate stack in the pFinFET region.

Referring to FIG. 12, portions of the gate electrode material layer 48L, the first work function material layer portion 44, the second work function material layer portion 46 and the gate dielectric layer 42L that are located above the topmost surface of the ILD layer 36 are removed by employing a planarization process, such as, for example, CMP. The remaining portion of the gate dielectric layer 42L in the nFinFET region constitutes a first gate dielectric 42A, and the remaining portion of the gate dielectric layer 42L in the pFinFET region constitutes a second gate dielectric 42B. The remaining portion of the first work function material layer portion 44 in the nFinFET region constitutes a first work function material portion 44A, and the remaining portion of the second work function material layer portion 46 in the pFinFET constitutes a second work function material portion 46B. The remaining portion of the gate electrode material layer 48L in the nFinFET region constitutes a first gate electrode 48A, and the remaining portion of the gate electrode material layer 48L in the pFinFET constitutes a second gate electrode 48B. The topmost surfaces of the first and second gate dielectrics (42A, 42B), the first and second work function material portions (44A, 46B) and the first and second gate electrodes (48A, 48B) are coplanar with the topmost surface of the ILD layer 36.

Thus, functional gate stacks are formed within the first and second gate cavities (38A, 38B). The functional gate stacks includes a first functional gate stack (42A, 44A, 48A) located in the nFinFET region and a second functional gate stack (42B, 46B, 48B) located in the pFinFET region. Each functional gate stack overlies a channel region of each of semiconductor fins 18$n$, 18$p$. The first functional gate stack (42A, 44A, 48A) and the gate spacer 26 located on each sidewall of the first functional gate stack together define a first functional gate stack 50A. The second functional gate stack (42B, 46B, 48B) and the gate spacer 26 located on each sidewall of the second functional gate stack together define a second functional gate structure 50B.

Figure 13:
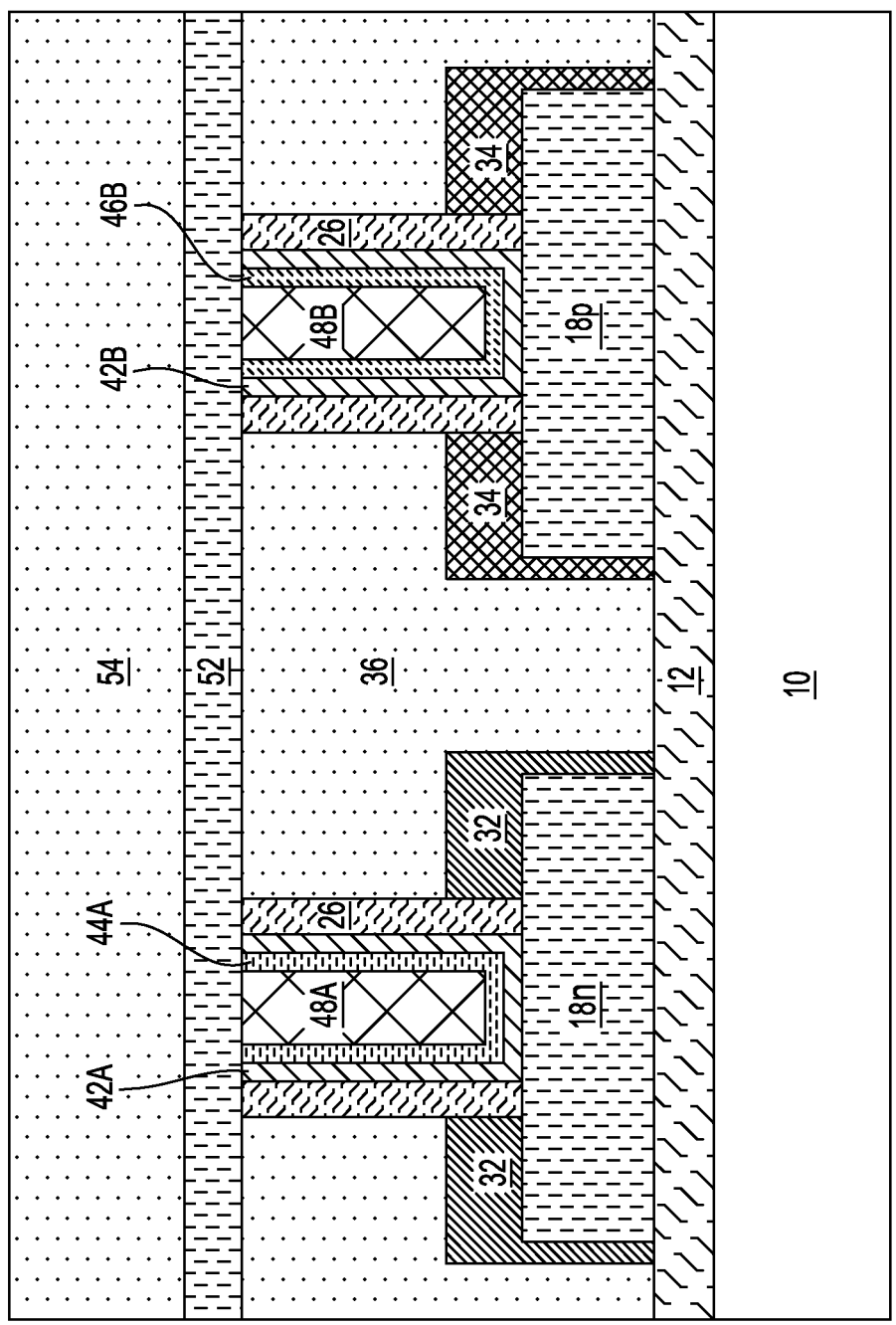
FIG. 13 is a cross-sectional view of the exemplary semiconductor structure of FIG. 12 after forming an etch stop layer over the ILD layer and the first and second functional gate stacks and a contact level dielectric layer over the etch stop layer.

Referring to FIG. 13, an etch stop layer 52 is deposited over the ILD layer 36 and the functional gate structures 50A, 50B utilizing a conventional deposition process such as, for example, CVD, PECVD, chemical solution deposition, or evaporation. The etch stop layer 52 is typically composed of a dielectric material such as, for example, silicon oxide, silicon nitride, silicon oxyntirde and silicon carbide. The thickness of the etch stop layer 52 can be from 5 nm to 30 nm, although lesser and greater thicknesses can be employed. In some embodiments of the present disclosure, the etch stop layer 52 is optional and can be omitted.

Next, a contact level dielectric layer 54 is deposited over the etch stop layer 52. The contact level dielectric layer 54 includes a dielectric material that is different, in terms of composition, from the dielectric material of the etch stop layer 52. In one embodiment, when the etch stop layer 52 includes silicon nitride, the contact level dielectric layer 54 may include silicon oxide. The thickness of the contact level dielectric layer 54 may be from 20 nm to 100 nm, although lesser and greater thicknesses.

Figure 14:
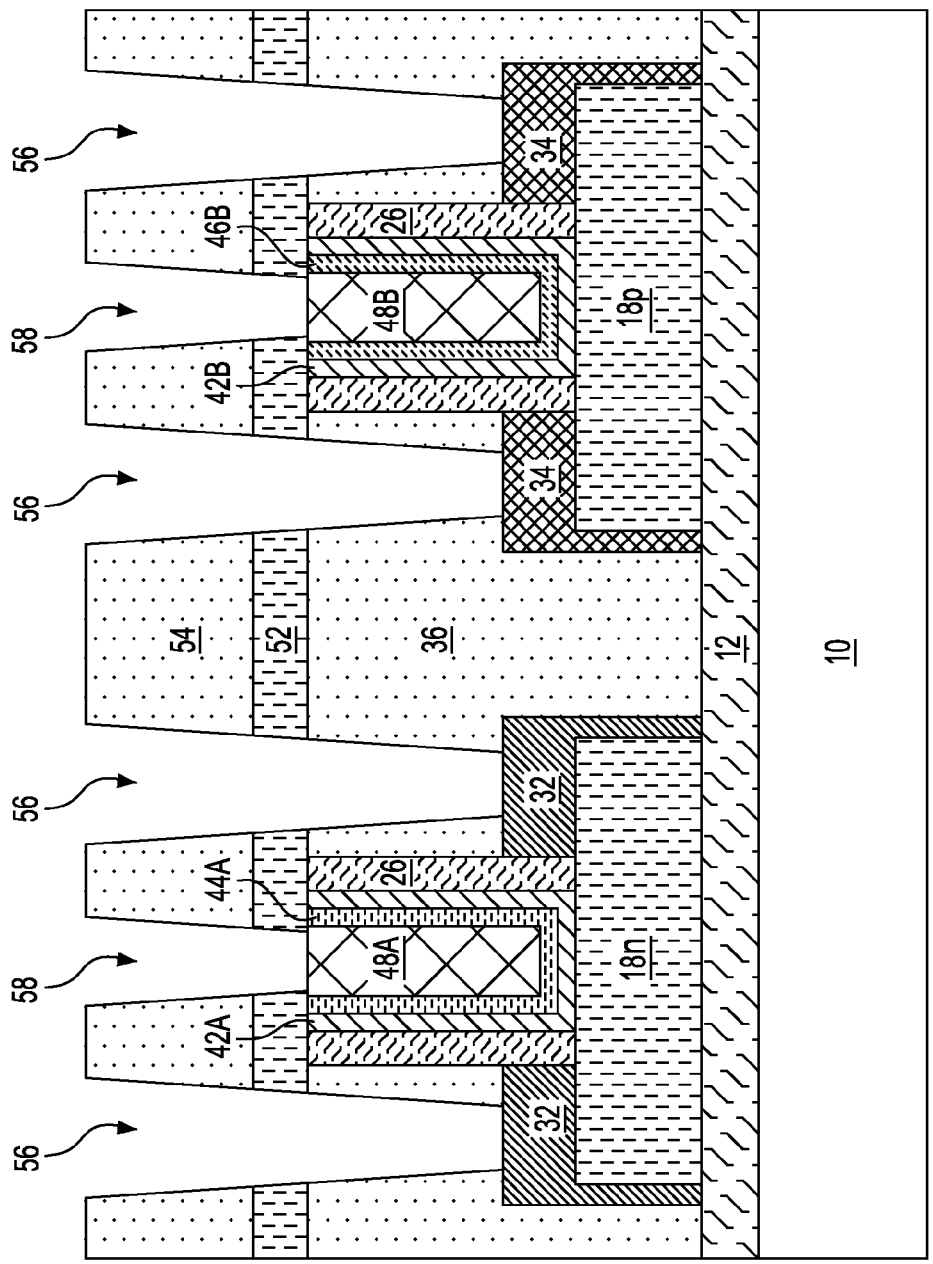
FIG. 14 is a cross-sectional view of the exemplary semiconductor structure of FIG. 13 after forming first contact openings through the contact level dielectric layer, the etch stop layer and an upper portion of the ILD layer to expose portions of the first and second source/drain regions and second contact openings through the contact level dielectric layer and the etch stop layer to expose portions of the first and second gate electrodes.

Referring to FIG. 14, first contact openings 56 are formed through the contact level dielectric layer 54, the etch stop layer 52 and an upper portion of the ILD layer 36 to expose portions of the first source/drain regions 32 and the second source/drain regions 34. Second contact openings 58 are formed through the contact level dielectric layer 54 and the etch stop layer 52 to expose portions of the first gate electrode 48A and the second gate electrode 48B.

The first contact openings 56 and the second contact openings 58 can be formed by lithography and etching. The lithographic process includes forming a photoresist layer (not shown) atop the contact level dielectric layer 54, exposing the photoresist layer to a desired pattern of radiation and developing the exposed photoresist layer utilizing a conventional resist developer. The etching process includes a dry etch, such as, for example, RIE or a wet chemical etch that selectively removes exposed portions of the contact level dielectric layer 56 and portions of the etch stop layer 54 and ILD layer 36 located beneath the exposed portions of the contact level dielectric layer 56. After etching, the remaining portions of the photoresist layer can be removed by a conventional resist striping process, such as, for example, ashing.

Figure 15:
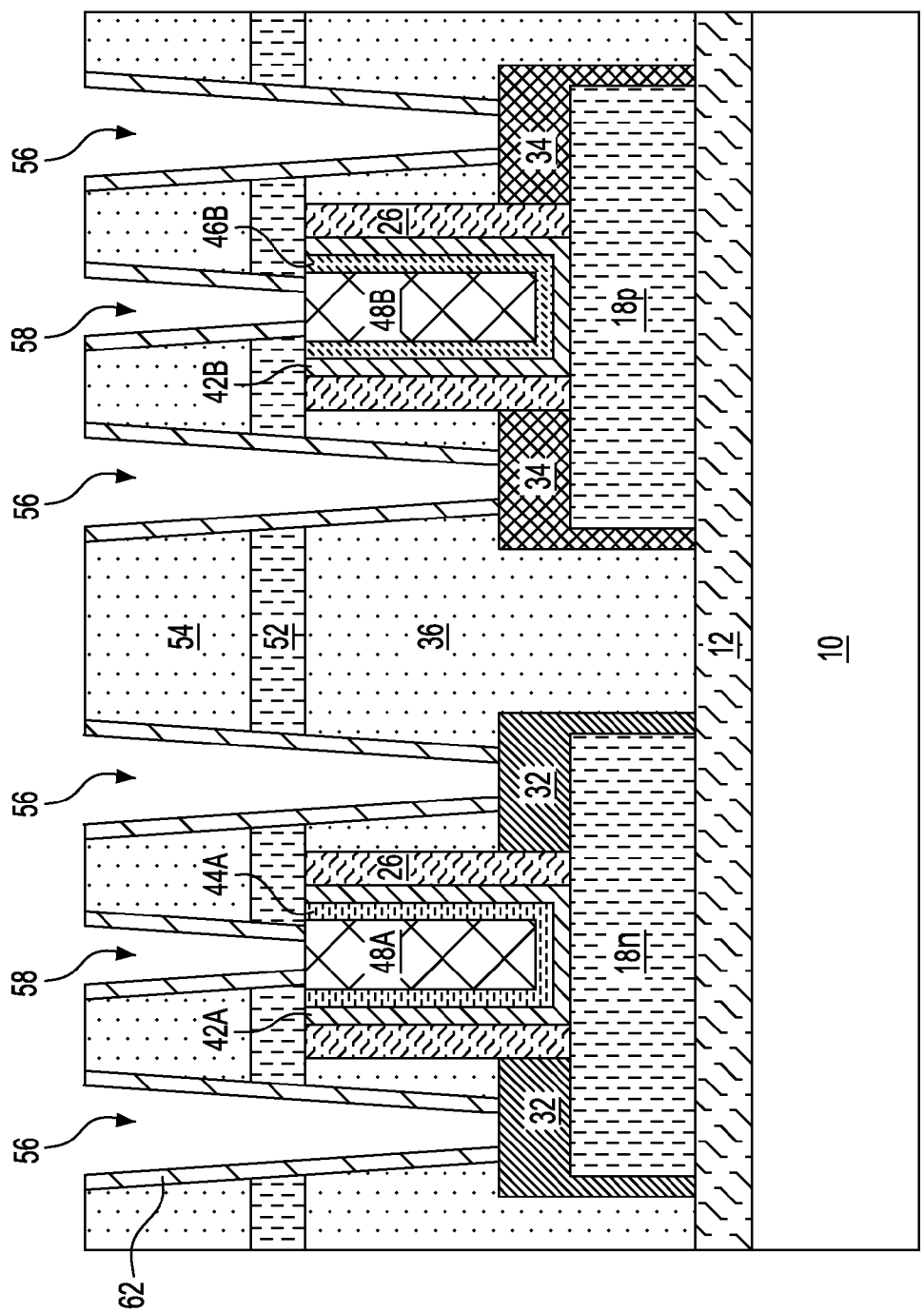
FIG. 15 is a cross-sectional view of the exemplary semiconductor structure of FIG. 14 after forming an inner spacer on sidewalls of each of the first and second contact openings.

Referring to FIG. 15, an inner spacer 62 is formed on each sidewall of the first contact openings 56 and the second contact openings 58. The inner spacer 62 can be formed by first forming a conformal inner spacer material layer (not shown) on sidewalls and bottom surfaces of the first contact openings 56, sidewalls and bottom surfaces of the second contact openings 58, and the topmost surface of the contact level dielectric layer 54. The inner spacer material layer can include a metal that does not react with dielectric materials of the contact level dielectric layer 54, the etch stop layer 52 and the ILD layer 36. Exemplary metals that can be employed as the inner spacer material layer include, but are not limited to Ti/TiN, Ta, W, Pd, Ru, TaN, and WN. In one embodiment, the inner spacer material layer is a bilayer of Ti/TiN. The inner spacer material layer can be formed utilizing a conventional deposition process including CVD or ALD. The thickness of the inner spacer material layer that is formed can be from 1 nm to 10 nm. Horizontal portions of the inner spacer material layer are removed by an anisotropic etch, such as, for example, RIE. Removing the inner spacer material layer form the bottom surfaces of the first contact openings 56 re-exposes the first and second source/drain region 32, 24, while removing the inner spacer material layer from the bottom surfaces of the second contact openings 58 re-exposes the first and second gate electrode 48A, 48B. The remaining portions of the inner spacer material layer present on sidewalls of the first and the second contact openings 56, 58 constitute the inner spacer 62. Each inner spacer 62 can serve as a barrier to prevent diffusion of metals in a contact liner material layer subsequently formed into the dielectric layers surrounding the first and the second contact openings 56, 58, thus improving the device reliability.

Figure 16:
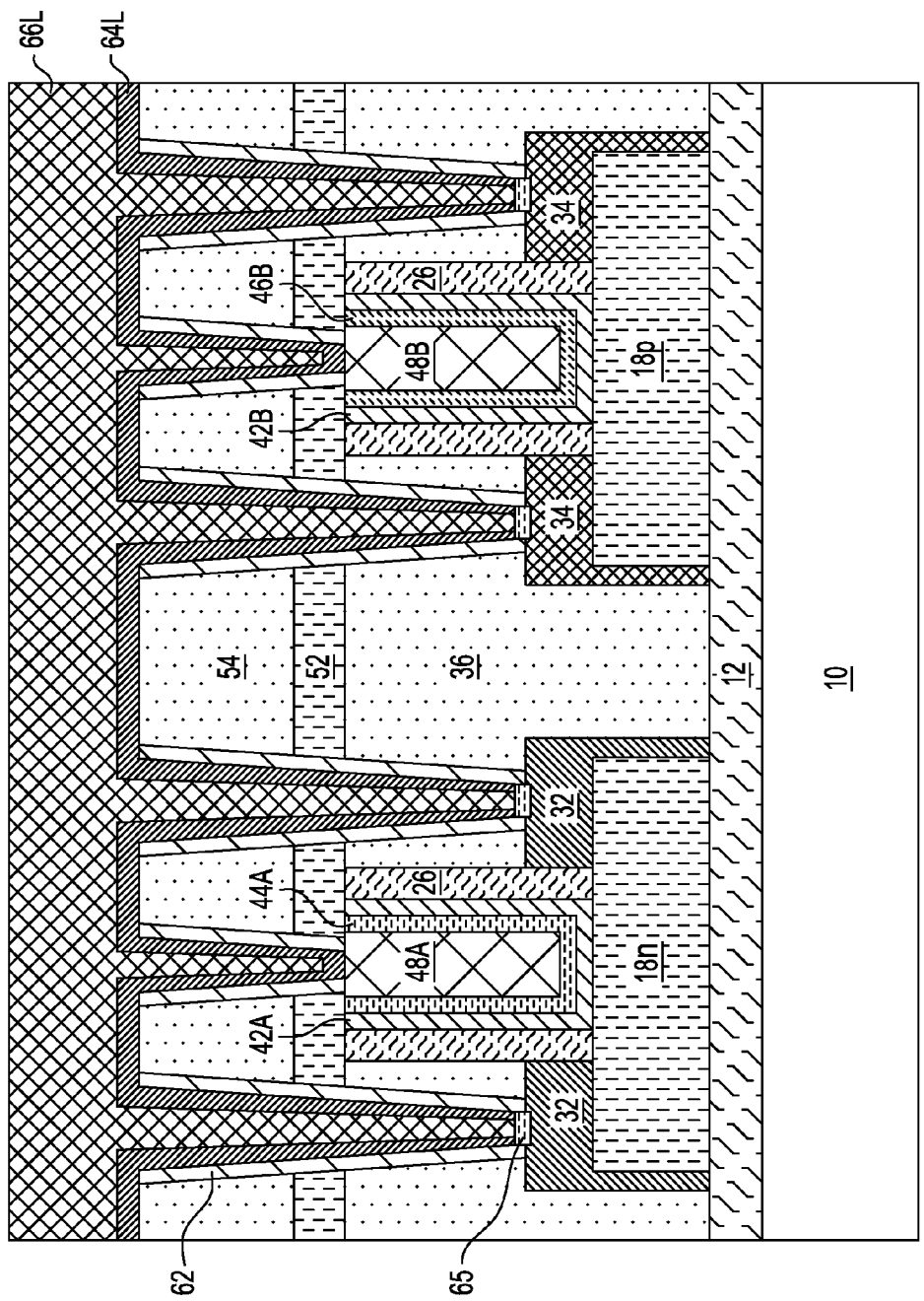
FIG. 16 is a cross-sectional view of the exemplary semiconductor structure of FIG. 15 after forming a contact liner material layer on the inner spacer, bottom surfaces of the first and second contact openings and a topmost surface of the contact level dielectric layer and filling remaining volumes of the first and second contact openings with a contact conductor material layer.

Referring to FIG. 16, a conformal contact liner material layer 64L is formed on inner spacer 62, bottom surfaces of the first and second contact openings 56, 58, and the topmost surface of the contact level dielectric layer 54. The contact liner material layer 64L may include a conductive material that can reduce contact resistance between contact conductors subsequently formed and source/drain regions. Exemplary conductive materials that can be employed as the contact liner material layer 64L include, but are not limited to NiPt, Co, NiAl and W. In one embodiment, the contact liner material layer 64L is composed of NiPt. The contact liner material layer 64L can be formed utilizing a conventional deposition process including CVD or ALD. The thickness of the contact liner material layer 64L that is formed can be from 1 nm to 15 nm.

Once formed, bottom portions of the contact liner material layer 64L that are in contact with the first source/drain regions 32 and the second source/drain regions 34 react with the underlying silicon in the first source/drain regions 32 and the second source/drain regions 34 to form liner silicide portions 65. The liner silicide portions 65 reduce contact resistance between contact conductors subsequently formed and semiconductor materials of the first source/drain regions 32 and the second source/drain regions 34.

In one embodiment and when the first and second gate electrodes 48A, 48B are composed of doped polysilicon, bottom portions of the contact liner material layer 64L that are in contact with the first and second gate electrodes 48A, 48B also react with the polysilicon so as to form liner silicide portions (not shown) at an interface between the contact liner material layer 64 and each of the first and second gate electrodes 48A, 48B.

After the contact liner material layer 64L has been formed, remaining volumes of the first and second contact openings 56, 58 are filled with a contact conductor material layer 66L. The contact conductor material layer 66L may include a metal such as, for example, Cu, Al, W, Ti, Ta or their alloys. The conductor material layer 66L can be formed by a conventional deposition process such as, for example, CVD, PVD, ALD, or plating. The contact conductor material layer 66L is deposited to a thickness so that a topmost surface of the contact conductor material layer 66L is located above the topmost surface of the contact level dielectric layer 54.

In some embodiments and when the contact liner material layer 64L is composed of NiPt and the contact conductor material layer 66L is composed of W, before forming the contact conductor material layer 66L, an adhesion layer (not shown) is provided atop the contact liner material layer 64L to improve the adhesion of the contact conductor material layer 66L to the contact liner material layer 64L.

Figure 17:
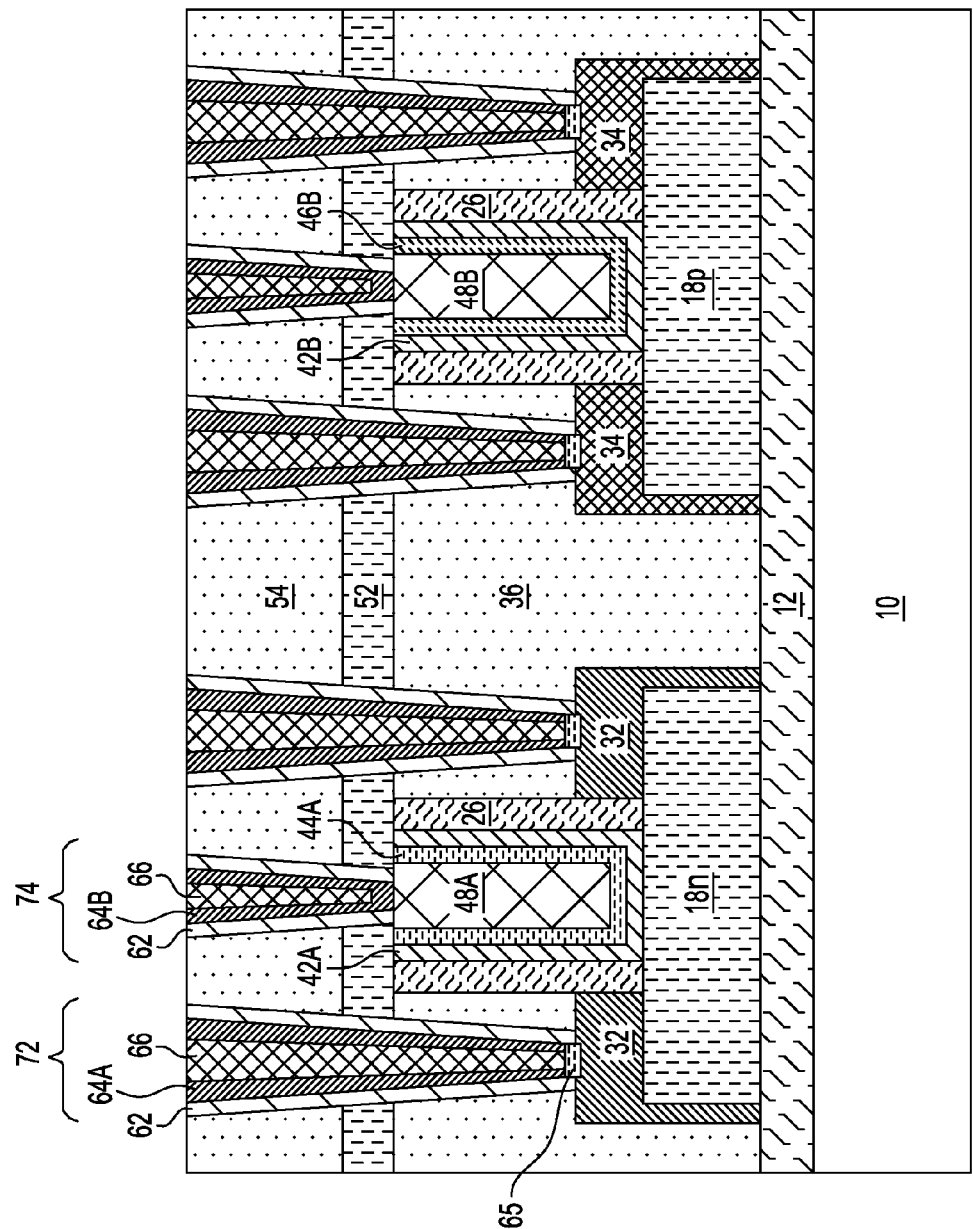
FIG. 17 is a cross-sectional view of the exemplary semiconductor structure of FIG. 16 after forming source/drain contact structures and gate contact structures.

Referring to FIG. 17, portions of the contact liner material layer 64L and the contact conductor material layer 66L that are located above the topmost surface of the contact level dielectric layer 54 are removed by employing a planarization process, such as, for example, CMP. The remaining portions of the contact liner material layer 64L in the first contact openings 56 constitute first contact liners 64A, the remaining portions of the contact liner material layer 64L in the second contact openings 58 constitute second contact liners 64B and the remaining portions of the conductor material layer 66L in the first and the second contact openings 56, 58 constitute contact conductor 66.

Thus, contact structures are formed within the first and second contact openings 56, 58. The contact structures include source/drain contact structures 72 (62, 64A, 65, 66) in contact with the first source/drain regions 32 and the second source/drain regions 34 and gate contact structures 74 (62. 64B, 66) in contact with the first gate electrode 48A and second gate electrode 48B.

While the present application has been particularly shown and described with respect to various embodiments thereof, it will be understood by those skilled in the art that the foregoing and other changes in forms and details may be made without departing from the spirit and scope of the present disclosure. It is therefore intended that the present application not be limited to the exact forms and details described and illustrated, but fall within the scope of the appended claims.

What is claimed is:

1. A method of forming a semiconductor structure comprising:
   forming a plurality of contact openings through at least one contact level dielectric layer and a portion of an interlevel dielectric (ILD) layer, the plurality of contact openings exposing portions of an epitaxial source region and an epitaxial drain region of at least one semiconductor device;
   forming an inner spacer on a sidewall of each of the plurality of contact openings, wherein an entirety of the inner spacer contacts the sidewall of each of the plurality of contact openings;
   forming a contact liner material layer on the inner spacer and bottom surfaces of the plurality of contact openings, wherein bottom portions of the contact liner material layer in the plurality of contact openings react with exposed portions of the epitaxial source region and the epitaxial drain region to form liner silicide portions; and forming a contact conductor layer to fill remaining volumes of the plurality of contact openings.

2. The method of claim 1, wherein the inner spacer comprises Ti/TiN, Ta, W, Pd, Ru, TaN or WN.

3. The method of claim 1, wherein the contact liner material layer comprises NiPt, Co, NiAl or W.

4. The method of claim 1, further comprising forming at least one gate contact structure to a functional gate structure of the at least one semiconductor device, wherein the forming the at least one gate contact structure comprises:

forming at least one other contact opening through the at least one contact level dielectric layer, the at least one other contact opening exposing a portion of a gate electrode of the functional gate structure; and forming another inner spacer on each sidewall of the at least one other contact opening, wherein the contact liner material layer is in contact with the another inner spacer and bottom surfaces of the at least one other contact opening, and wherein the contact conductor layer fills a remaining volume of the at least one other contact opening.

5. The method of claim 4, wherein a bottom portion of the liner material layer in the at least one other contact opening reacts with an exposed portion of the gate electrode to form another liner silicide portion.

6. The method of claim 1, further comprising forming an adhesion layer on the contact liner material layer prior to forming the contact conductor layer.

7. The method of claim 6, where in the adhesion layer comprises TiN.

8. The method of claim 1, further comprising forming at least one semiconductor device on a substrate, the forming at least one semiconductor device comprising:

forming a first semiconductor fin in a first device region of the substrate and a second semiconductor fin in a second device region of the substrate;

forming a first sacrificial gate structure over a portion of the first semiconductor fin and a second sacrificial gate structure over a portion of the second semiconductor fin, each of the first and second sacrificial gate structures including a sacrificial gate stack and a gate spacer located on each sidewall of the sacrificial gate stack;

forming a first epitaxial source region and a first epitaxial drain region on portions of the first semiconductor fin that are not covered by the first sacrificial gate structure;

forming a second epitaxial source region and a second epitaxial drain regions on portions of the second semiconductor fin that are not covered by the second sacrificial gate structure;

forming the ILD layer over the substrate to cover exposed portions of the first and second semiconductor fins and the first and second source and drain regions, the ILD layer having a topmost surface coplanar with a topmost surface of the first and second sacrificial gate structures;

removing the sacrificial gate stack from each of the first sacrificial gate structure to provide a first gate cavity in the first device region and a second gate cavity in the second device region;

forming a gate dielectric layer on sidewalls and bottom surfaces of the first and second gate cavities;

forming a first work function material layer portion on a portion of the gate dielectric layer in the first device region;

forming a second work function material layer portion on a remaining portion of the gate dielectric layer in the second device region; and forming a gate electrode material layer to fill remaining volumes of the first and second gate cavities.

9. The method of claim 8, wherein the first device region is an n-type fin field effect transistor (nFinFET) region, and wherein the second device region is a p-type fin field effect transistor (pFinFET) region.

10. The method of claim 8, further comprising removing portions of the gate electrode material, the first work function material layer portion, the second work function material layer portion and the gate dielectric layer that are located above the topmost surface of the first dielectric layer to provide a first functional gate structure in the first device region and a second functional gate structure in the second device region.

11. The method of claim 8, further comprising forming a first fin-defining structure in the first device region and a second fin-defining structure in the second device region prior to the forming the first semiconductor fin in the first device region of the substrate and the second semiconductor fin in the second device region of the substrate.

12. The method of claim 11, wherein the forming the first fin-defining structure in the first device region and the second fin-defining structure in the second device region comprises:

forming a hard mask layer on a top semiconductor layer of a semiconductor-on-insulator (SOI) substrate; and patterning the hard mask layer to define the first fin-defining structure and the second fin-defining structure.

13. A semiconductor structure comprising:

at least one semiconductor device including a functional gate structure and an epitaxial source region and an epitaxial drain region located on opposite sides of the functional gate structure, the functional gate structure, the epitaxial source region and the epitaxial drain region laterally surrounded by an interlevel dielectric (ILD) layer; and a plurality of source/drain contact structures extending through at least one contact level dielectric layer and a portion of the ILD layer and in contact with portions of the epitaxial source region and the epitaxial drain region, wherein each of the plurality of source/drain contact structures comprises:

an inner spacer located on a sidewall of each of a plurality of source/drain contact openings that is laterally surrounded by the at least one contact level dielectric layer and the portion of the ILD layer, wherein an entirety of the inner spacer contacts the sidewall of each of the plurality of contact openings, a contact liner having a first portion in contact with the inner spacer and a second portion in contact with the portions of the epitaxial source and drain regions, wherein the second portion of the contact liner is a liner silicide portion formed by a reaction between a material of the first portion of the contact liner and a semiconductor material of the epitaxial source and drain regions, and a contact conductor filling in a remaining volume of each of the plurality of source/drain contact openings.

14. The semiconductor structure of claim 13, wherein the inner spacer comprises Ti/TiN, Ta, W, Pd, Ru, TaN or WN.

15. The semiconductor structure of claim 13, wherein the first portion of the contact liner comprises NiPt, Co, NiAl or W, and wherein the second portion of the contact liner comprises NiPt silicide, Co silicide, NiAl silicide or W silicide.

16. The semiconductor structure of claim 13, wherein the contact conductor comprises Cu, Al, W, Ti, Ta or their alloys.

17. The semiconductor structure of claim 13, wherein the epitaxial source and drain regions comprise SiGe or SiC.

18. The semiconductor structure of claim 13, further comprising at least one gate contact structure extending through the at least one contact level dielectric layer and in contact with a portion of a gate electrode of the functional gate structure, wherein the at least one gate contact structure comprises:
  another inner spacer located on sidewalls of the at least one gate contact opening that is laterally surrounded by the at least one contact dielectric layer;
  another contact liner having a first portion in contact with the second inner spacer and a second portion in contact with the portion of the gate electrode of the functional gate structure; and
  a second contact conductor filling in a remaining volume of the at least one gate contact opening.

19. The semiconductor structure of claim 13, wherein the at least one semiconductor device comprises a plurality of fin field effect transistors (FinFETs) formed on a substrate, the plurality of FinFETs comprising:
  a first FinFET formed in a first device region of the substrate, the first FinFET comprising:
    a first gate stack formed in a first gate cavity and straddling a channel portion of a first semiconductor fin, wherein the first gate stack includes a first gate dielectric formed on sidewalls and a bottom of the first gate cavity, a first work function material portion formed on the first gate dielectric, and a first gate electrode filling in a remaining volume of the first gate cavity, and
    first epitaxial source and drain regions located on opposite sides of the first gate stack; and
  a second FinFET formed in a second device region of the substrate, the second FinFET comprising:
    a second gate stack formed in a second gate cavity and straddling a channel portion of a second semiconductor fin, wherein the second gate stack includes a second gate dielectric formed on sidewalls and a bottom of the second gate cavity, a second work function material portion formed on the second gate dielectric, and a second gate electrode filling in a remaining volume of the second gate cavity, and
    second epitaxial source and drain regions located on opposite sides of the second gate stack.

20. A semiconductor structure comprising: a plurality of fin field effect transistors (FinFETs) formed on a substrate, the plurality of FinFETs comprising: a first FinFET formed in a first device region of the substrate, the first FinFET comprising: a first gate stack formed in a first gate cavity and straddling a channel portion of a first semiconductor fin, wherein the first gate stack includes a first gate dielectric formed on sidewalls and a bottom of the first gate cavity, a first work function material portion formed on the first gate dielectric, and a first gate electrode filling in a remaining volume of the first gate cavity, and first epitaxial source and drain regions located on opposite sides of the first gate stack; and a second FinFET formed in a second device region of the substrate, the second FinFET comprising: a second gate stack formed in a second gate cavity and straddling a channel portion of a second semiconductor fin, wherein the second gate stack includes a second gate dielectric formed on sidewalls and a bottom of the second gate cavity, a second work function material portion formed on the second gate dielectric, and a second gate electrode filling in a remaining volume of the second gate cavity, and second epitaxial source and drain regions located on opposite sides of the second gate stack; and a plurality of source/drain contact structures extending through at least one contact level dielectric layer and a portion of an interlevel dielectric (ILD) layer and in contact with portions of the first epitaxial source and drain regions and the second epitaxial source and drain regions, wherein each of the plurality of source/drain contact structures comprises: an inner spacer located on a sidewall of each of a plurality of source/drain contact openings that is laterally surrounded by the at least one contact level dielectric layer and the portion of the ILD layer, wherein an entirety of the inner spacer contacts the sidewall of each of the plurality of contact openings, a contact liner having a first portion in contact with the inner spacer and a second portion in contact with the portions of the epitaxial source and drain regions, and a contact conductor filling in a remaining volume of each of the plurality of source/drain contact openings.

* * * * *